(12) United States Patent
Yanai

(10) Patent No.: US 10,991,712 B2
(45) Date of Patent: Apr. 27, 2021

(54) SEMICONDUCTOR DEVICE AND MANUFACTURING METHOD THEREOF

(71) Applicant: TOSHIBA MEMORY CORPORATION, Minato-ku (JP)

(72) Inventor: Yoshihiro Yanai, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 171 days.

(21) Appl. No.: 16/271,926

(22) Filed: Feb. 11, 2019

(65) Prior Publication Data
US 2019/0348430 A1 Nov. 14, 2019

(30) Foreign Application Priority Data
May 14, 2018 (JP) .............................. JP2018-093104

(51) Int. Cl.
*H01L 27/11573* (2017.01)
*H01L 27/1157* (2017.01)
(Continued)

(52) U.S. Cl.
CPC .. *H01L 27/11573* (2013.01); *H01L 21/76816* (2013.01); *H01L 21/76877* (2013.01);
(Continued)

(58) Field of Classification Search
CPC ............... H01L 21/31144; H01L 21/32; H01L 21/76877; H01L 21/76816; H01L 23/5226;
(Continued)

(56) References Cited

U.S. PATENT DOCUMENTS

| 8,530,350 B2 | 9/2013 | Freeman et al. |
| 8,680,604 B2 * | 3/2014 | Higashi ............. H01L 27/11575 257/324 |

(Continued)

FOREIGN PATENT DOCUMENTS

| JP | 2011-222994 | 11/2011 |
| JP | 2014-183225 | 9/2014 |

(Continued)

*Primary Examiner* — Zandra V Smith
*Assistant Examiner* — Jeremy J Joy
(74) *Attorney, Agent, or Firm* — Oblon, McClelland, Maier & Neustadt, L.L.P.

(57) ABSTRACT

An end of a stacked-structure of conductive and insulating layers above a substrate has a staircase structure. The staircase includes a step pair. The risers of steps are opposed to each other. The step pairs are provided at different levels in the form in the staircase. First contact-plugs are provided on treads of respective steps of the first step part. A second contact-plug is provided in either an intermediate region between the first and the second steps of the step pair or the second step to extend in the stacked structure in a direction in which the conductive and insulating layers are stacked. A CMOS circuit is provided below the stacked structure and is connected to the second contact-plug. The second contact-plug is provided in either the intermediate region on which the first contact-plug is not formed or the second step on which the first contact-plug is not formed.

8 Claims, 22 Drawing Sheets

(51) Int. Cl.
*H01L 27/11582* (2017.01)
*H01L 21/768* (2006.01)
*H01L 23/522* (2006.01)
*H01L 23/528* (2006.01)

(52) U.S. Cl.
CPC ...... *H01L 23/5226* (2013.01); *H01L 23/5283* (2013.01); *H01L 27/1157* (2013.01); *H01L 27/11582* (2013.01)

(58) Field of Classification Search
CPC ........... H01L 23/5286; H01L 27/11573; H01L 27/1157; H01L 27/11582; H01L 27/11575; H01L 27/11524; H01L 27/11551; H01L 27/11578
See application file for complete search history.

(56) References Cited

U.S. PATENT DOCUMENTS

| | | | | |
|---|---|---|---|---|
| 8,890,229 | B2* | 11/2014 | Watanabe | H01L 29/7926 257/314 |
| 9,165,937 | B2 | 10/2015 | Yip et al. | |
| 9,659,950 | B2 | 5/2017 | Yip et al. | |
| 10,090,315 | B2* | 10/2018 | Fukuzumi | H01L 27/11568 |
| 2010/0323505 | A1* | 12/2010 | Ishikawa | H01L 21/31144 438/492 |
| 2011/0244666 | A1 | 10/2011 | Kim et al. | |
| 2012/0132983 | A1* | 5/2012 | Fukuzumi | H01L 29/7926 257/324 |
| 2013/0161821 | A1* | 6/2013 | Hwang | H01L 27/11556 257/773 |
| 2015/0036407 | A1* | 2/2015 | Nakajima | H01L 29/7926 365/63 |
| 2015/0062843 | A1* | 3/2015 | Higashitsuji | H01L 27/11582 361/752 |
| 2015/0228623 | A1* | 8/2015 | Oh | H01L 27/11582 257/4 |
| 2017/0033117 | A1* | 2/2017 | Lee | H01L 27/1157 |
| 2017/0141032 | A1* | 5/2017 | Lee | H01L 23/5226 |
| 2017/0179025 | A1 | 6/2017 | Yun et al. | |
| 2017/0263613 | A1* | 9/2017 | Murakoshi | H01L 27/11575 |
| 2017/0309634 | A1 | 10/2017 | Noguchi et al. | |
| 2019/0319040 | A1* | 10/2019 | Ishii | H01L 21/31144 |

FOREIGN PATENT DOCUMENTS

| | | |
|---|---|---|
| JP | 5960369 | 8/2016 |
| JP | 2016-526782 | 9/2016 |
| JP | 2017-112363 | 6/2017 |
| JP | 2014-517530 | 7/2017 |
| JP | 2017-195275 | 10/2017 |

* cited by examiner

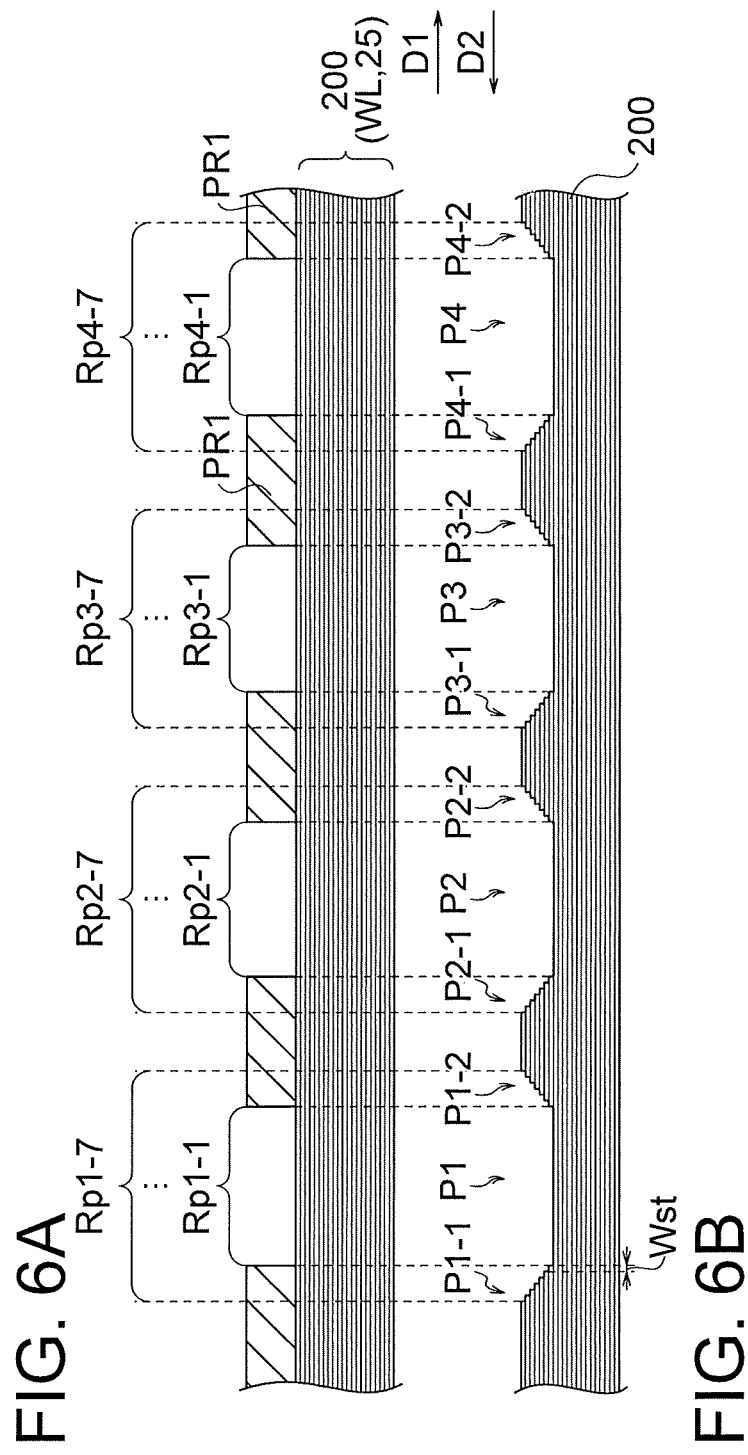

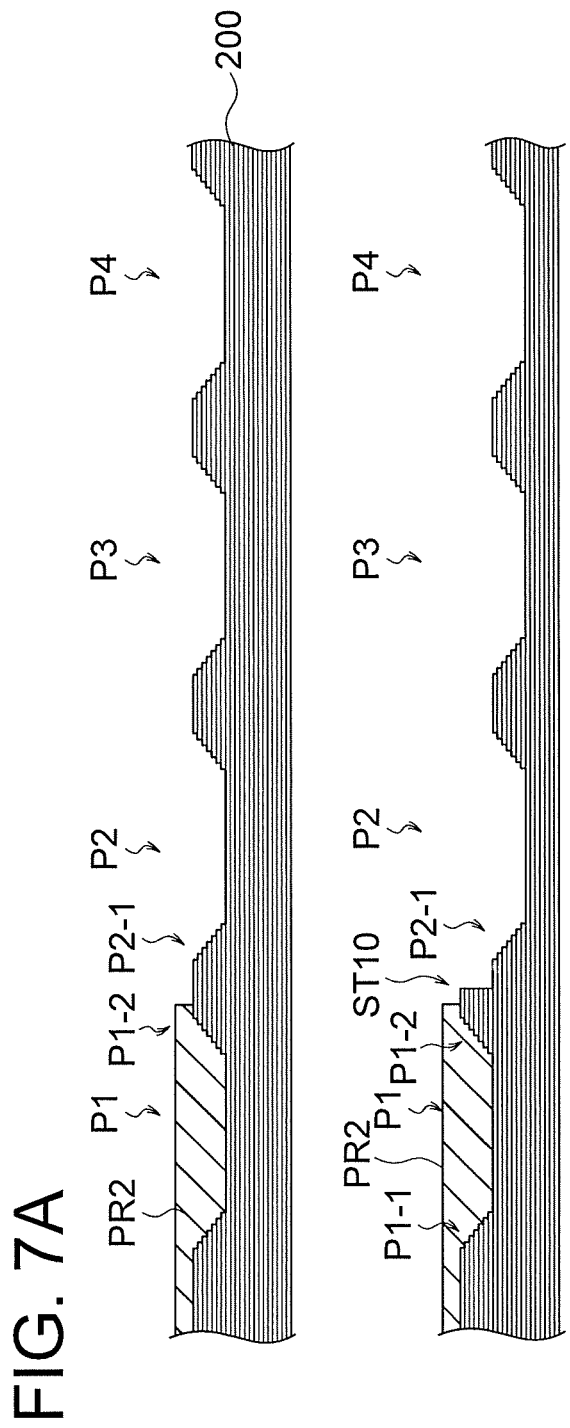

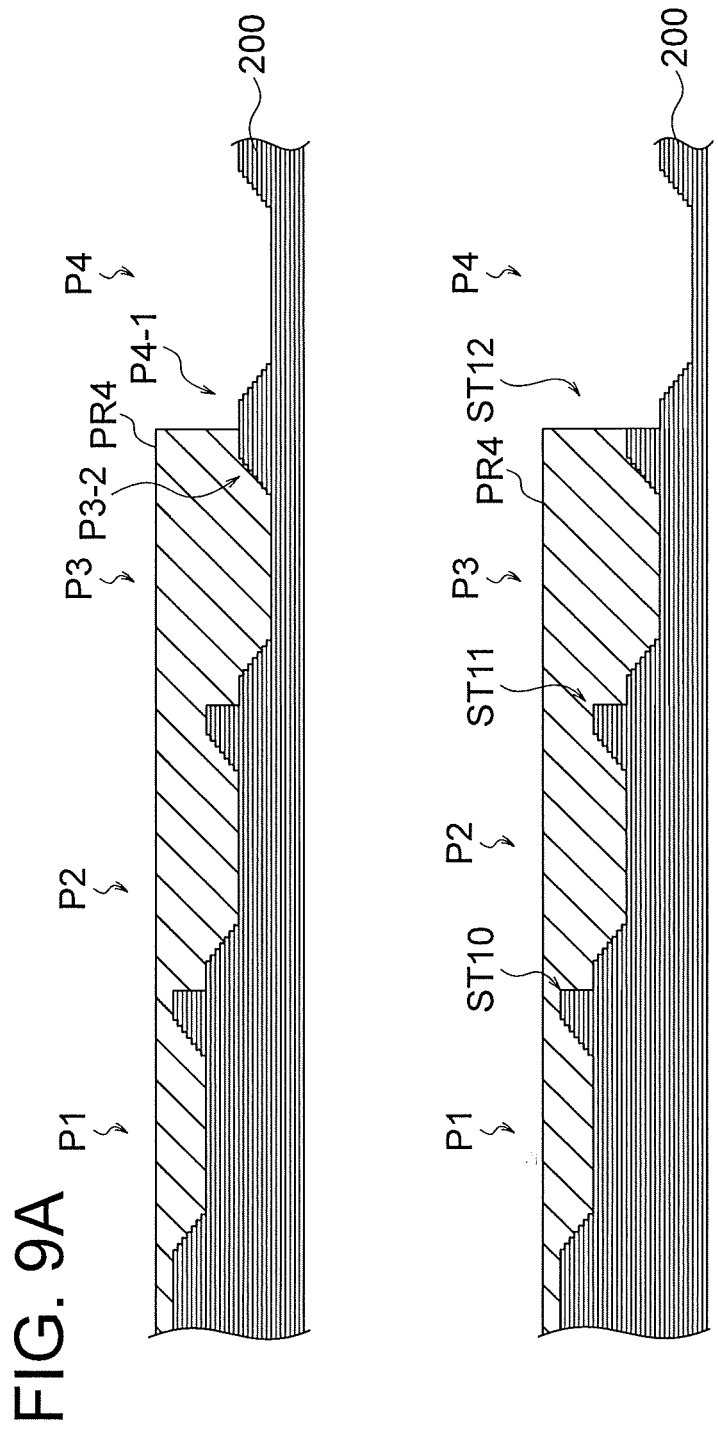

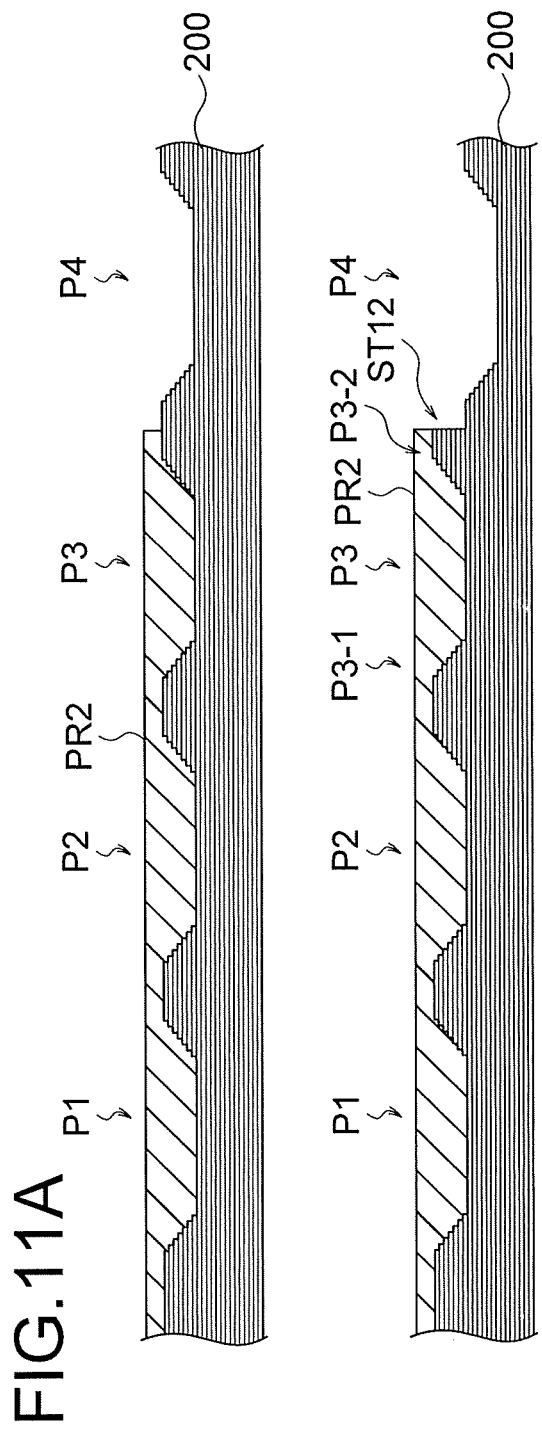

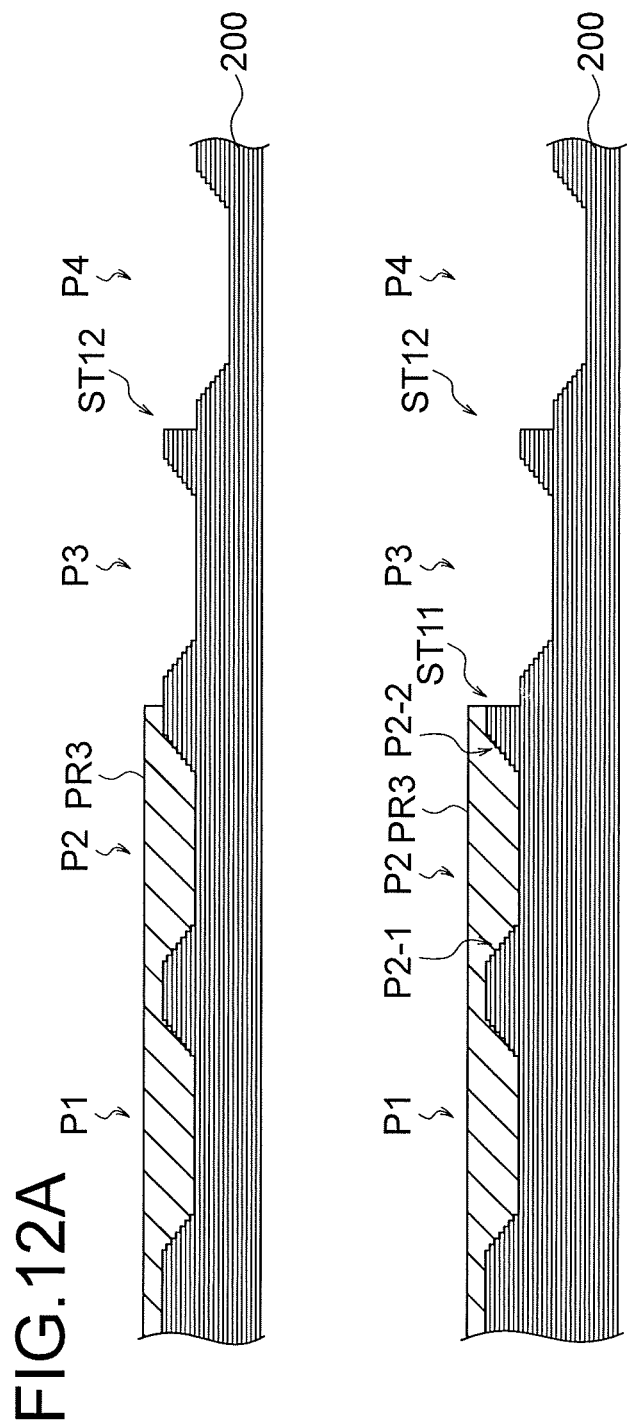

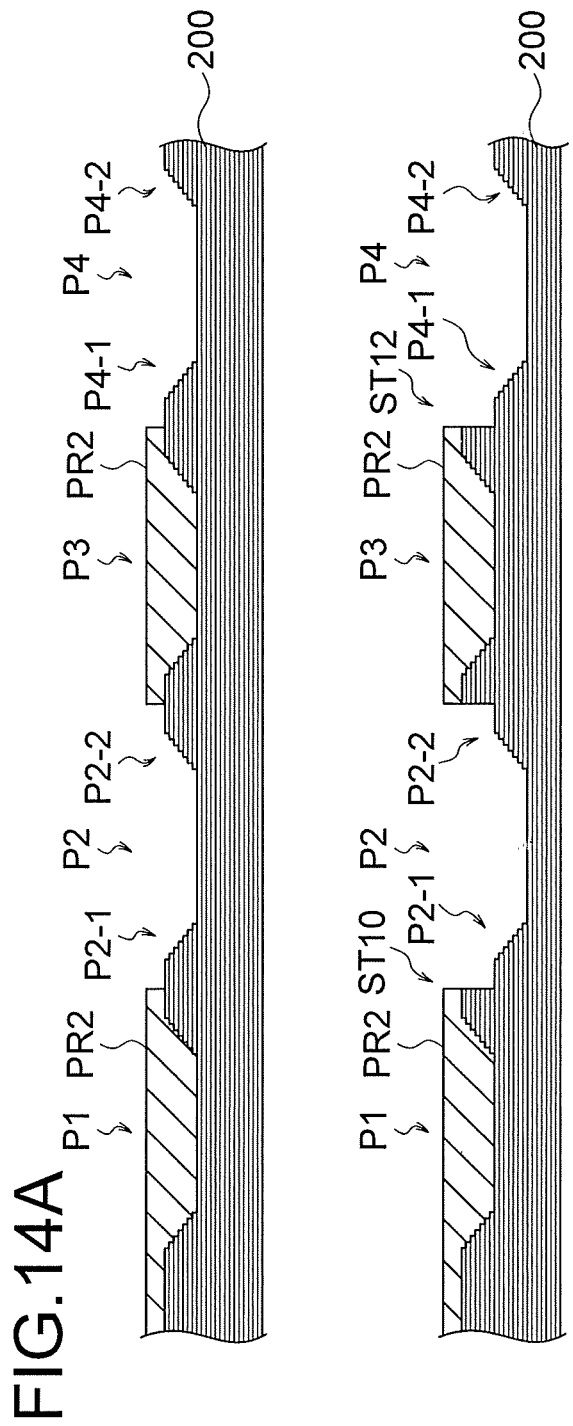

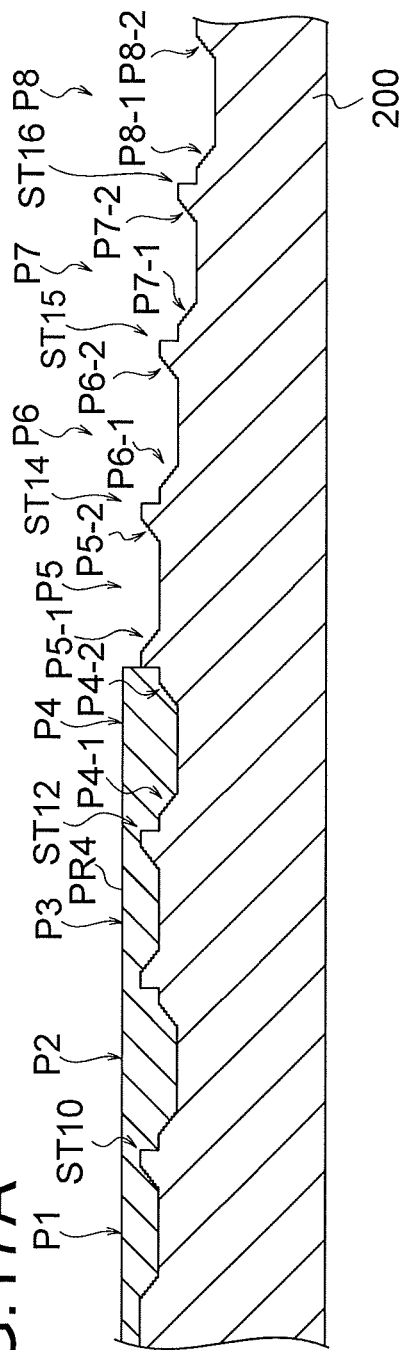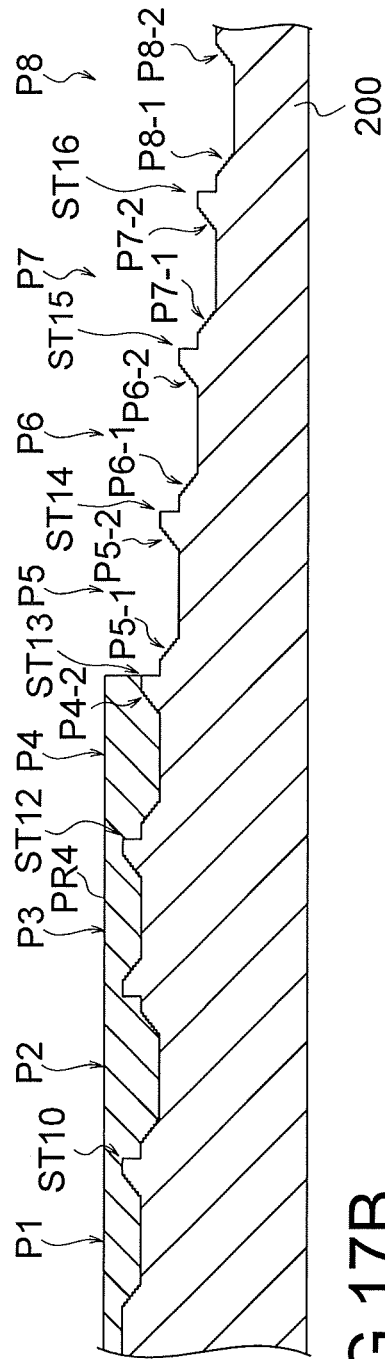

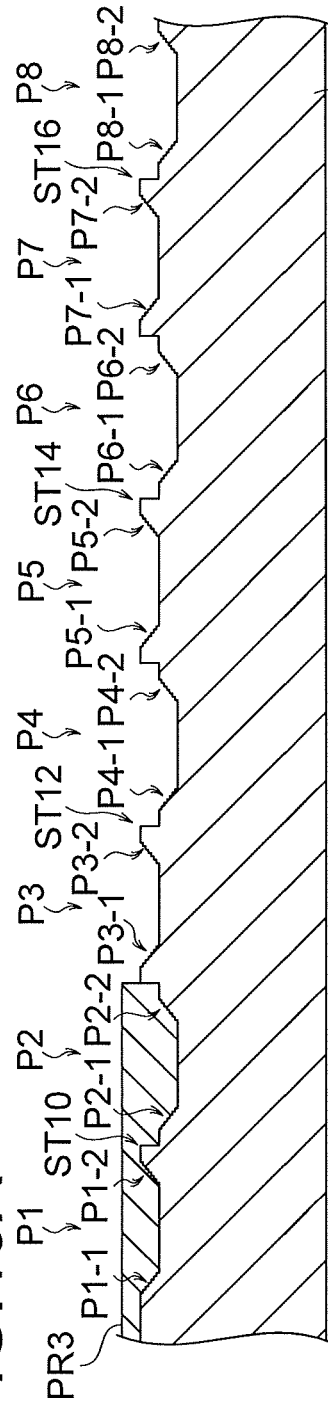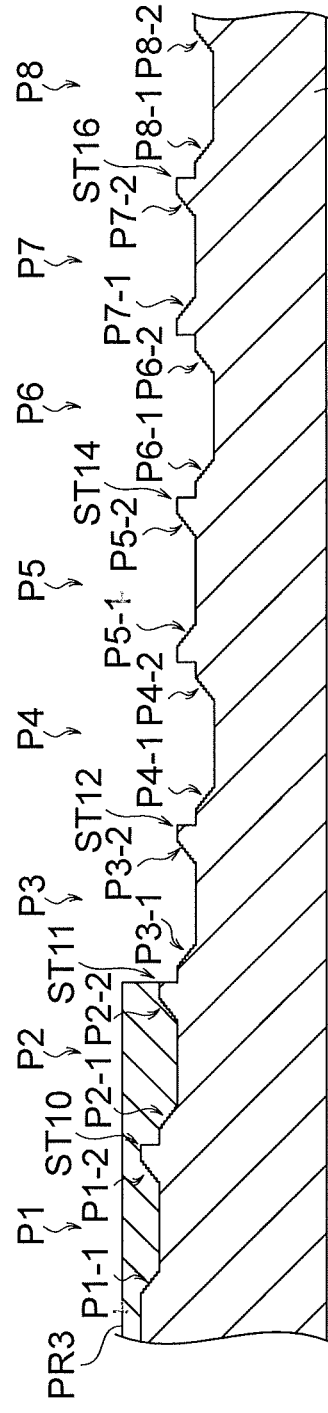

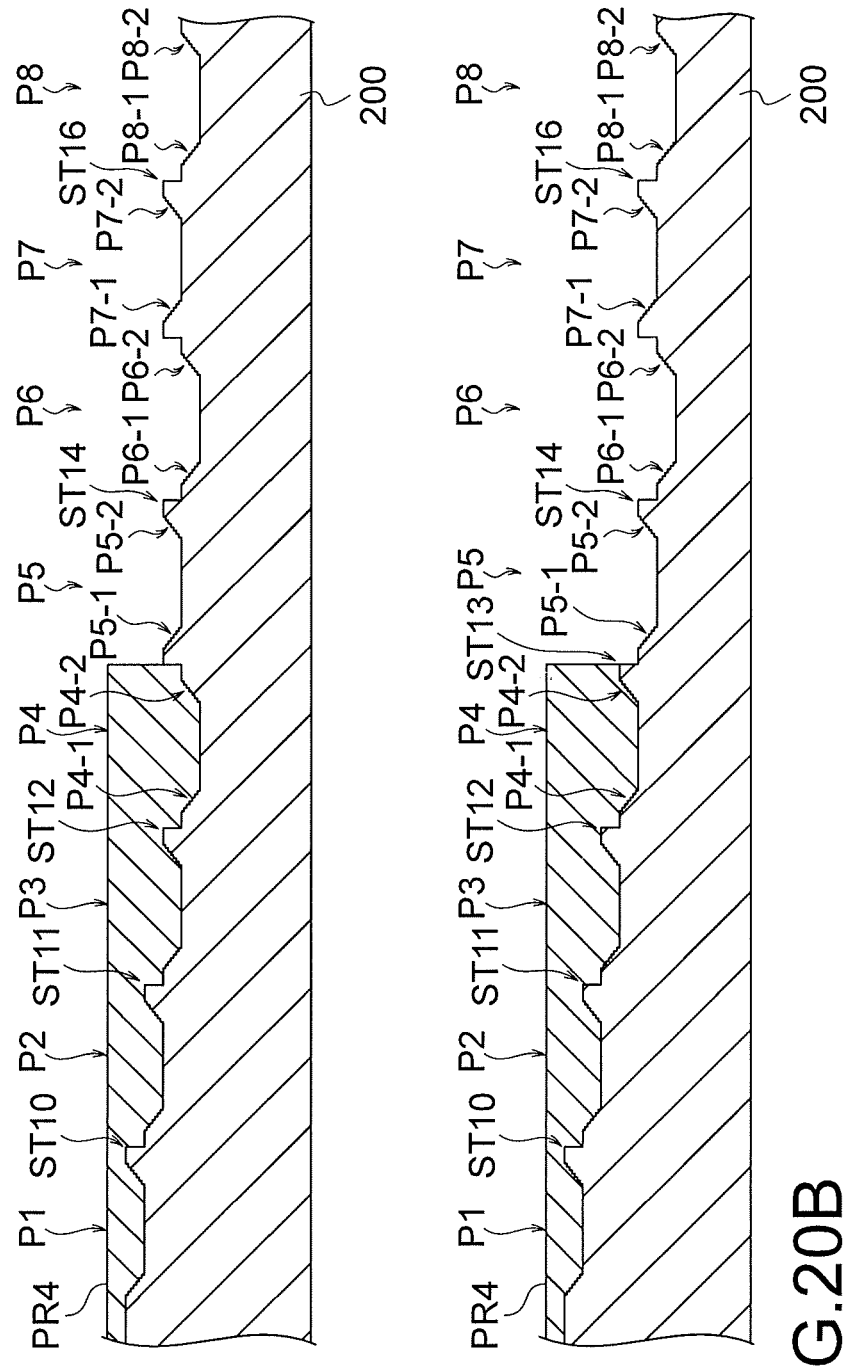

SEMICONDUCTOR DEVICE AND MANUFACTURING METHOD THEREOF

CROSS REFERENCE TO RELATED APPLICATIONS

This application is based upon and claims the benefit of priority from the prior Japanese Patent Application No. 2018-093104, filed on May 14, 2018, the entire contents of which are incorporated herein by reference.

FIELD

The embodiments of the present invention relate to a semiconductor device and manufacturing method thereof.

BACKGROUND

Semiconductor memories including a three-dimensional memory cell array, in which memory cells are arranged three-dimensionally, have been developed. Word lines of a semiconductor memory each have a stacked structure stacked on a substrate. In order to connect a contact plug to each of the word lines having this stacked structure, a staircase structure (a terrace structure) is formed at an end of the stacked structure. This staircase structure is formed at an end of the stacked structure of each word line by, after a lithography process, repeating an etching process for the word line and a slimming process for a resist film multiple times.

However, repeating the etching process and the sliming process increases variation in the thickness of the resist film, so that a dimensional accuracy of the staircase structure is deteriorated. In order to handle this problem of dimensional variation of the staircase structure, it is necessary to make the length or width of a tread of the staircase structure large. In this case, there is a problem that a layout area of a semiconductor memory is increased. Further, because the sliming process is performed multiple times, a technique is required in which the thickness of the resist film can be made thick and the resist film can be applied with high viscosity. This causes increase of the manufacturing cost of a semiconductor memory.

BRIEF DESCRIPTION OF THE DRAWINGS

FIGS. 6A to 10 are cross-sectional views illustrating an example of a manufacturing method of a semiconductor device according to the first embodiment;

FIGS. 11A to 13B are cross-sectional views illustrating an example of a manufacturing method of a semiconductor device according to a modification of the first embodiment;

FIGS. 14A to 18B are cross-sectional views illustrating an example of a manufacturing method of a semiconductor device according to a second embodiment;

FIGS. 19A to 21B showing an example of a manufacturing method of a semiconductor device according to a modification of the second embodiment.

DETAILED DESCRIPTION

Figure 1:
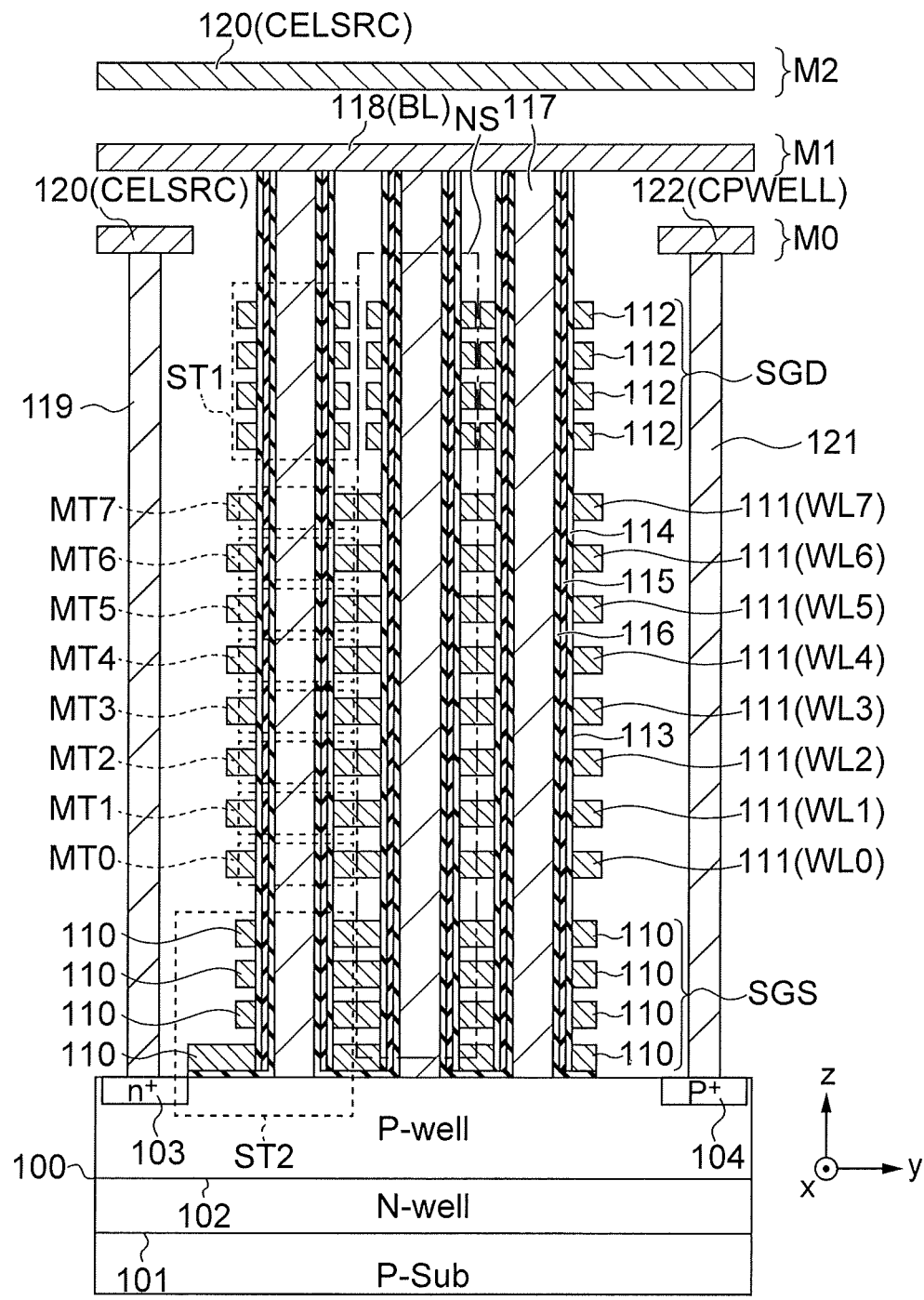
FIG. 1 is a diagram illustrating a configuration example of a memory cell array in a semiconductor device according to a first embodiment.

Embodiments will now be explained with reference to the accompanying drawings. The present invention is not limited to the embodiments. In the embodiments, "an upper direction" or "a lower direction" refers to a relative direction when a direction perpendicular to a surface of a semiconductor substrate on which semiconductor elements are provided is assumed as "an upper direction". Therefore, the term "upper direction" or "lower direction" occasionally differs from an upper direction or a lower direction based on a gravitational acceleration direction. In the present specification and the drawings, elements identical to those described in the foregoing drawings are denoted by like reference characters and detailed explanations thereof are omitted as appropriate.

A semiconductor device according to an embodiment comprises a substrate and a plurality of conductive layers and a plurality of insulating layers that are stacked above the substrate. An end of a stacked structure formed by the conductive layers and the insulating layers has a staircase structure in which the conductive layers form treads of respective steps. The staircase structure includes a step pair formed by a first step part and a second step part, risers of respective steps being opposed to each other. A plurality of the step pairs are provided at different levels in the form of a staircase in the staircase structure. A plurality of first contact plugs are provided on treads of respective steps of the first step part. A second contact plug is provided in at least either an intermediate region between the first step part and the second step part of the step pair or the second step part to extend in the stacked structure in a direction in which the conductive layers and the insulating layers are stacked. A CMOS circuit is provided below the stacked structure and is electrically connected to the second contact plug. The second contact plug is provided in at least either the intermediate region in which the first contact plug is not formed thereon or the second step part in which the first contact plug is not formed thereon.

First Embodiment

FIG. 1 is a diagram illustrating a configuration example of a memory cell array in a semiconductor device according to a first embodiment. A memory cell array MCA is a three-dimensional memory cell array in which memory cells are arranged three-dimensionally, for example. In FIG. 1, an insulating portion other than an insulating film formed in a memory hole 113 is omitted for simplicity. Further, although silicon is described as an example of a semiconductor in the following embodiments, semiconductors other than silicon may also be used.

The present specification uses an XYZ orthogonal coordinate system for convenience of description. In this coordinate system, two directions that are parallel to a main surface of a substrate 100 and are perpendicular to each other are an X-direction and a Y-direction, and a direction perpendicular to both the X-direction and the Y-direction is a Z-direction. Word lines WL as conductive layers are stacked in the Z-direction.

As illustrated in FIG. 1, an n-well region 101 is formed in the semiconductor substrate 100. A p-well region 102 is formed on the n-well region 101. A plurality of NAND strings NS are formed on the p-well region 102. Specifically, a plurality of wiring layers 110 functioning as select gate lines SGS, a plurality of wiring layers 111 functioning as the word lines WL, and a plurality of wiring layers 112 functioning as select gate lines SGD are formed on the p-well region 102.

The wiring layers 110 are formed by four layers, for example, are electrically connected to a select gate line SGS that is common to a plurality of NAND strings NS, and function as gate electrodes of two selecting transistors ST2.

The wiring layers 111 are formed by eight layers, for example, and each layer is electrically connected to a common word line WL.

The wiring layers 112 are formed by four layers, for example, are electrically connected to a corresponding select gate line SGD for every NAND string NS, and each function as a gate electrode of one selecting transistors ST1.

The memory holes 113 are formed to penetrate through the wiring layers 110, 111, and 112 and reach the p-well region 102. A block insulating film 114, a charge storage film (insulating film) 115, and a gate dielectric film 116 are formed in turn on a side surface of the memory hole 113. A conductive film 117 is embedded in the memory hole 113. The conductive film 117 functions as a current path of a NAND string NS. A wiring layer 118 is formed at an upper end of the conductive film 117, which functions as a bit line BL.

As described above, the selecting transistor ST2, a plurality of memory cell transistors MT, and the selecting transistor ST1 are stacked on the p-type well region 102 in turn. One memory hole 113 corresponds to one NAND string NS.

An n+ impurity diffusion layer 103 and a p+ impurity diffusion layer 104 are formed in a surface of the p-type well region 102.

A contact plug 119 is formed on the n+ impurity diffusion layer 103, and a wiring layer 120 functioning as a source line CELSRC is formed on the contact plug 119. The source line CELSRC is also formed in an M2 layer. The source line CELSRC in the M2 layer is electrically connected to a voltage generating circuit.

A contact plug 121 is formed on the p+ impurity diffusion layer 104, and a wiring layer 122 functioning as a well line CPWELL is formed on the contact plug 121.

An M0 layer in which the wiring layers 120 and 122 are formed is formed above the wiring layer 112 (the select gate line SGD) and below an M1 layer in which the wiring layer 118 is formed.

A plurality of the above configurations are arranged in a depth direction in the diagram of FIG. 1. One finger is configured by a set of a plurality of NAND strings NS arranged in a line in the depth direction.

Further, the wiring layers 110 function as a common select gate line SGS in the same block and are electrically connected to each other. The gate dielectric film 116 is formed between the lowermost wiring layer 110 and the p-well region 102. The lowermost wiring layer 110, which is adjacent to the n+ impurity diffusion layer 103, and the gate dielectric film 116 are formed to reach a portion near the n+ impurity diffusion layer 103.

Therefore, when the selecting transistor ST2 is turned on, a formed channel electrically connects a memory cell transistor MT0 and the n+ impurity diffusion layer 103 to each other. A voltage generating circuit applies a voltage to the well line CPWELL to supply a potential to the conductive film 117.

Figure 2:
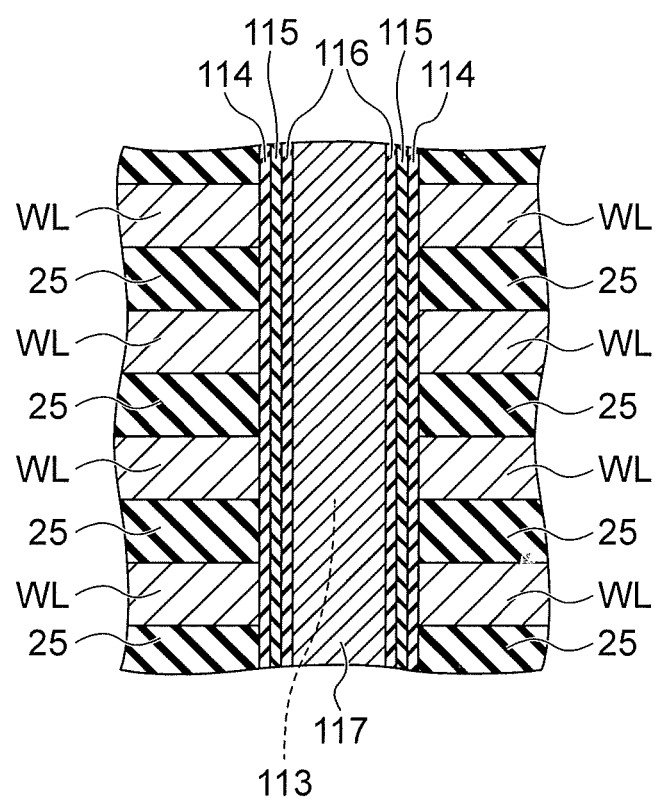
FIG. 2 is an enlarged cross-sectional view of a portion in which the conductive film penetrates through the conductive layers WL and a plurality of insulating layers.

FIG. 2 is an enlarged cross-sectional view of a portion in which the conductive film 117 penetrates through the conductive layers (the word lines) WL and a plurality of insulating layers 25. In FIG. 2, an insulating layer between the conductive layers WL, which is omitted in FIG. 1, is represented as the insulating layer 25.

Between each conductive layer WL and the conductive film 117, the block insulating film 114, the charge storage film 115, and the gate dielectric film 116 are provided in this order from the conductive layer WL side. The block insulating film 114 is in contact with the conductive layer WL. The gate dielectric film 116 is in contact with the conductive film 117. The charge storage film 115 is provided between the block insulating film 114 and the gate dielectric film 116.

The conductive film 117 functions as a channel, the conductive layer WL functions as a control gate, and the charge storage film 115 functions as a data storing layer that stores therein charges injected from the conductive film 117. That is, a memory cell in which a control gate surrounds a channel is formed at an intersection of the conductive film 117 and each conductive layer WL.

The semiconductor device according to the present embodiment is a nonvolatile semiconductor storage device that can electrically erase and write data freely and can retain the stored content even when the semiconductor device is turned off. For example, the memory cell is a memory cell having a charge trap structure. The charge storage film 115 has a number of traps confining charges (electrons), and is a silicon nitride film, for example. The gate dielectric film 116 is a silicon dioxide film, for example, and serves as a potential barrier when charges are injected to the charge storage film 115 from the conductive film 117 or when charges stored in the charge storage film 115 are diffused to the conductive film 117. The block insulating film 114 is a silicon dioxide film, for example, and prevents diffusion of charges stored in the charge storage film 115 to the conductive layers WL. It suffices that the semiconductor device is a NAND EEPROM, for example.

Figure 3:
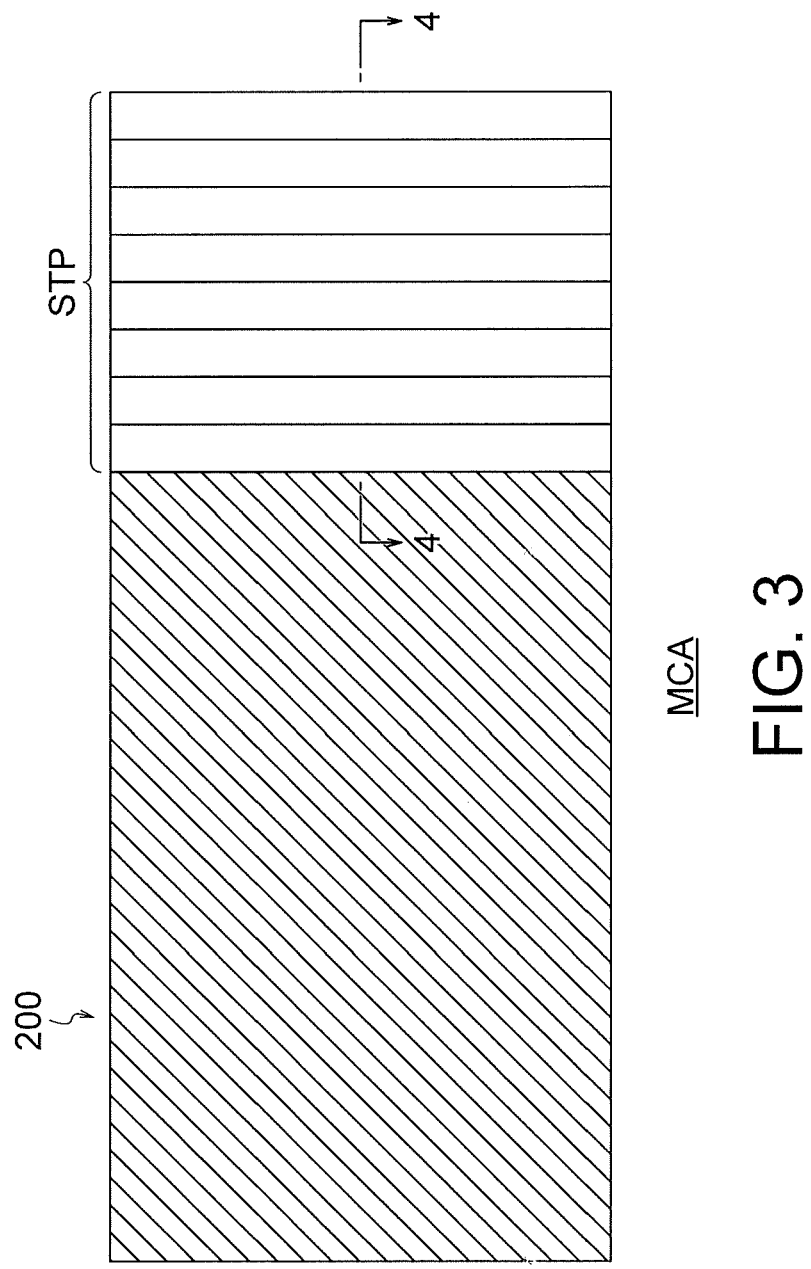
FIG. 3 is a schematic plan view illustrating a configuration example of a memory cell array.

FIG. 3 is a schematic plan view illustrating a configuration example of a memory cell array. The memory cell array MCA includes a stacked structure 200 of the conductive layers WL and the insulating layers 25, and includes a plurality of memory cells arranged three-dimensionally, as described with reference to FIGS. 1 and 2.

The memory cell array MCA is square, and includes a staircase structure STP on at least one side of an end thereof. The staircase structure STP is a connection region for connecting a contact plug (not illustrated) to each conductive layer WL of the stacked structure 200.

Figure 4:
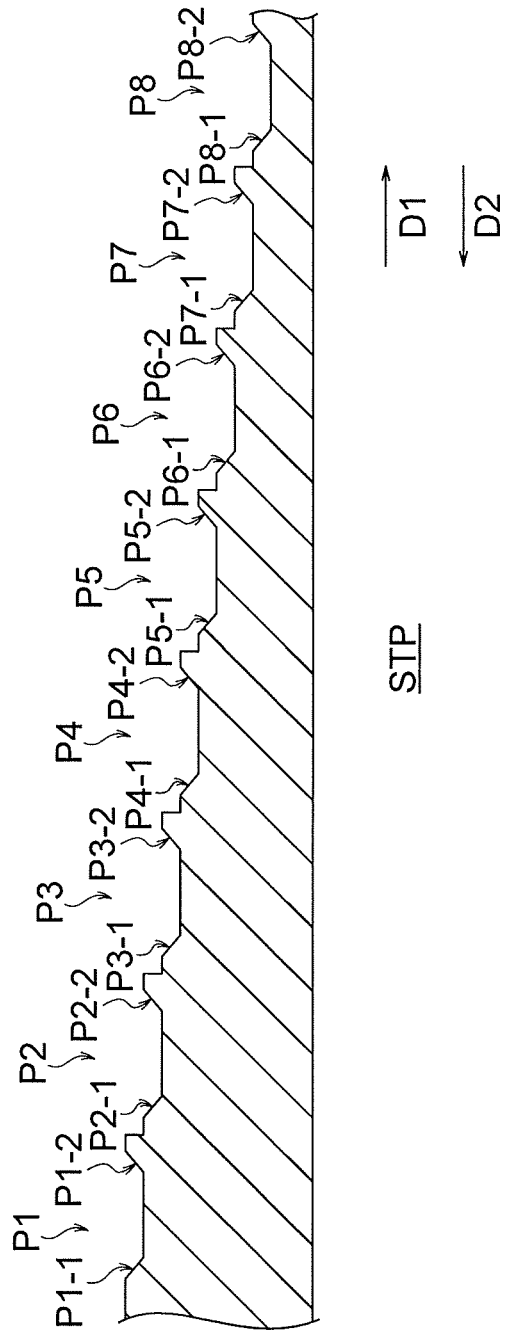
FIG. 4 is a cross-sectional view taken along a line 4-4 in FIG. 3.

FIG. 4 is a cross-sectional view taken along a line 4-4 in FIG. 3. A contact plug or the like connected to the conductive layer WL is omitted in FIG. 4. The staircase structure STP includes step pairs P1 to P8. The step pairs P1 to P8 are arranged from the top to the bottom of the staircase structure STP in this order. The step pairs P1 to P8 are provided in layers at different levels, respectively, and are configured in the form of a staircase that steps down in a direction D1 from the memory array MCA side to an end thereof.

The step pair P1 includes a first step part P1_1 and a second step part P1_2 opposed to each other. The step pair P2 includes a first step part P2_1 and a second step part P2_2 opposed to each other. The step pairs P3 to P8 include first step parts P3_1 to P8_1 and second step parts P3_2 to P8_2 opposed to each other, respectively.

A first step part Pn_1 (n=1 to 8) is configured in the form of a staircase facing in the direction D1. That is, the first step part Pn_1 is a staircase that steps down in the direction D1 similarly to the step pairs P1 to P8. A second step part Pn_2 is configured in the form of a staircase facing in a direction D2 opposite to the direction D1. That is, the second step part Pn_2 is a staircase that steps down in the direction D2, contrary to the step pairs P1 to P8. Therefore, in each step pair Pn, the first step part Pn_1 and the second step part Pn_2 are opposed to each other. A flat landing is provided between the first step part Pn_1 and the second step part Pn_2 of a step pair Pn.

Figure 5:
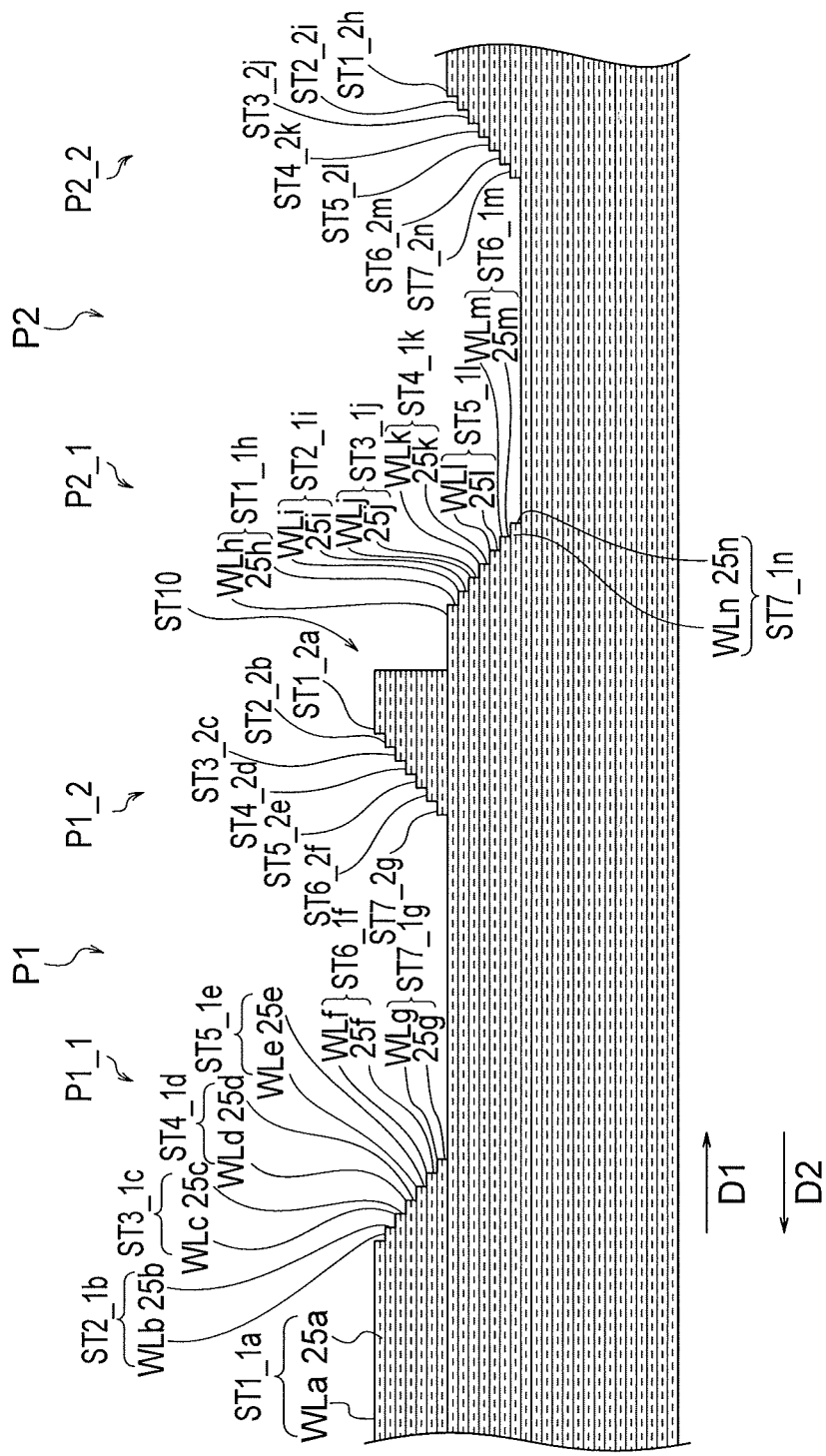
FIG. 5 is a cross-sectional view illustrating a configuration example of the step pairs.

FIG. 5 is a cross-sectional view illustrating a configuration example of the step pairs P1 and P2. Although FIG. 5 only illustrates the configurations of the two adjacent step pairs P1 and P2, the other adjacent step pairs P2 to P8 have identical configurations.

The step pair P1 is provided in conductive layers WLa to WLg and insulating layers 25a to 25g. The first step part P1_1 includes steps ST1_1a to ST7_1g. The conductive layer WLa and the insulating layer 25a configure the uppermost step ST1_1a. The conductive layer WLb and the insulating layer 25b configure the second step ST2_1b. Similarly, the conductive layers WLc to WLg and the insulating layers 25c to 25g configure the third to seventh steps ST3_1c to ST7_1g. For convenience, in each of the steps ST1_1a to ST7_1g, an interface between a corresponding one of the conductive layers WLa to WLg and a corresponding one of the insulating layers 25a to 25g is represented with a broken line.

The steps ST1_1a to ST7_1g are configured to form a staircase that steps down in the direction D1. The conductive layers WLa to WLg are exposed in treads of the respective steps ST1_1a to ST7_1g, and side surfaces of the conductive layers WLa to WLg and side surfaces of the insulating layers 25a to 25g are exposed in risers. In the risers of the respective steps ST1_1a to ST7_1g, the conductive layers WLa to WLg are upper layers and the insulating layers 25a to 25g are lower layers.

Meanwhile, the second step part P1_2 of the step pair P1 includes steps ST1_2a to ST7_2g. The conductive layer WLa and the insulating layer 25a configure the uppermost step ST1_2a. The conductive layer WLb and the insulating layer 25b configure the second step ST2_2b. Similarly, the conductive layers WLc to WLg and the insulating layers 25c to 25g configure the third to seventh steps ST3_2c to ST7_2g. That is, the steps ST1_2a to ST7_2g of the second step part P1_2 are formed by the same layers as the steps ST1_1a to ST7_1g of the first step part P1_1, respectively. In addition, the first and second step parts P1_1 and P1_2 have staircase shapes that are substantially symmetrical with respect to a center of the landing of the step pair P1.

The steps ST1_2a to ST7_2g are configured in the form of a staircase that steps down in the direction D2. The conductive layers WLa to WLg are exposed in treads of the respective steps ST1_2a to ST7_2g, and side surfaces of the conductive layers WLa to WLg and side surfaces of the insulating layers 25a to 25g are exposed in risers. In the risers of the respective steps ST1_2a to ST7_2g, the conductive layers WLa to WLg are upper layers and the insulating layers 25a to 25g are lower layers.

Although the step pair P2 includes steps similarly to the step pair P1, those steps are provided in conductive layers WLh to WLn and insulating layers 25h to 25n arranged below the insulating layer 25g.

The first step part P2_1 of the step pair P2 includes steps ST1_1h to ST7_1n. The conductive layer WLh and the insulating layer 25h configure the uppermost step ST1_1h of the step pair P2. The conductive layer WLi and the insulating layer 25i configure the second step ST2_1i. Similarly, the conductive layers WLj to WLn and the insulating layers 25j to 25n configure third to seventh steps ST3_1j to ST7_1n.

The steps ST1_1h to ST7_1n are configured in the form of a staircase that steps down in the direction D1. The conductive layers WLh to WLn are exposed in treads of the respective steps ST1_1h to ST7_1n, and side surfaces of the conductive layers WLh to WLn and side surfaces of the insulating layers 25h to 25n are exposed in risers. In the risers of the respective steps ST1_1h to ST7_1n, the conductive layers WLh to WLn are upper layers and the insulating layers 25h to 25n are lower layers.

Meanwhile, the second step part P2_2 of the step pair P2 includes steps ST1_2h to ST7_2n. The conductive layer WLh and the insulating layer 25h configure the uppermost step ST1_2h of the step pair P2. The conductive layer WLi and the insulating layer 25i configure the second step ST2_2i. Similarly, the conductive layers WLj to WLn and the insulating layers 25j to 25n configure the third to seventh steps ST3_2j to ST7_2n. That is, the steps ST1_2h to ST7_2n of the second step part P2_2 are formed by the same layers as the steps ST1_1h to ST7_1n of the first step part P2_1, respectively. The first and second step parts P2_1 and P2_2 have staircase shapes that are substantially symmetrical with respect to the center of the landing of the step pair P2.

The steps ST1_2h to ST7_2n are configured in the form of a staircase that steps down in the direction D2. The conductive layers WLh to WLn are exposed in treads of the respective steps ST1_2h to ST7_2n, and side surfaces of the conductive layers WLh to WLn and side surfaces of the insulating layers 25h to 25n are exposed in risers. In the risers of the respective steps ST1_2h to ST7_2n, the conductive layers WLh to WLn are upper layers and the insulating layers 25h to 25n are lower layers.

A step ST10 is provided between the step pairs P1 and P2 adjacent to each other, which has substantially the same height as the first or second step part P1_1 or P1_2. The steps ST1_1h and ST1_2h in the uppermost layer of the step pair P2 is in the same layer as the landing of the step pair P1 adjacent to the step pair P2 in the direction D2. Therefore, the steps ST1_1a to ST7_1g and ST1_1h to ST7_1n of the first step parts P1_1 and P2_1 of the adjacent step pairs P1 and P2 are continuous. Because the steps ST1_1a to ST7_1g and ST1_1h to ST7_1n are continuous, the conductive layers WLa to WLn are exposed in the treads of the steps ST1_1a to ST7_1g and ST1_1h to ST7_1n of the first step parts P1_1 and P2_1, respectively. Therefore, it is possible to provide a conduct plug on the tread of each of the steps ST1_1a to ST7_1g and ST1_1h to ST7_1n. Accordingly, each of the conductive layers WLa to WLn can be electrically connected to the contact plug to be led out.

The step pairs P3 to P8 also have identical configurations as the step pairs P1 and P2, although the details are not illustrated. Therefore, the steps of the first step parts P1_1 to P8_1 of the step pairs P1 to P8 are continuous, so that the conductive layers WL are exposed in the treads of the steps of the first step parts P1_1 to P8_1, respectively. Accordingly, it is possible to provide a contact plug (not illustrated) on the tread of each step of the first step parts P1_1 to P8_1, so that each of the conductive layers WL is electrically connected to the contact plug. Due to this configuration, the conductive layers WL can be led out as word lines via the contact plugs. Each of the conductive layers WL is continuous to a corresponding step of the first step parts P1_1 to P8_1 and is electrically connected thereto.

Meanwhile, although the second step parts P1_2 to P8_2 of the step pairs P1 to P8 are formed simultaneously in a forming process of the first step parts P1_1 to P8_1, those are not electrically connected to the conductive layers WL in the memory cell array MCA. Therefore, the second step parts P1_2 to P8_2 are not used for connection to contact plugs, but remain as dummies.

Figure 10:
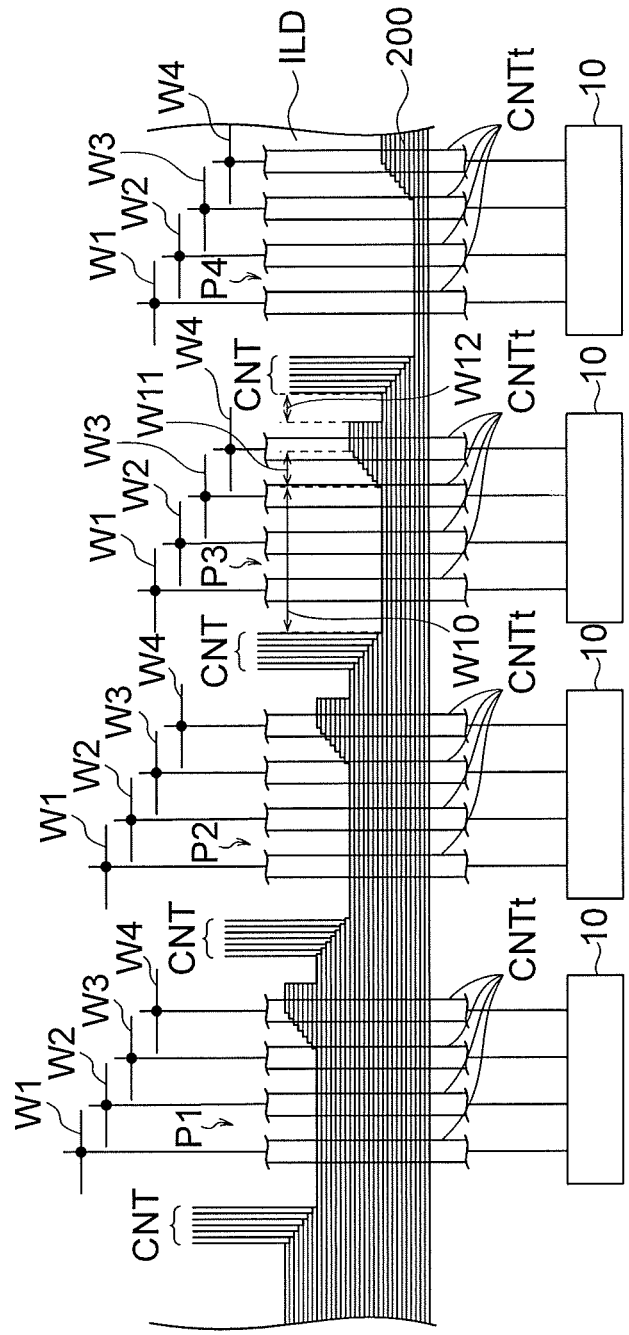

Further, as illustrated in FIG. 10, a CMOS (Complementary Metal Oxide Semiconductor) circuit is provided below the stacked structure 200 in some cases. For example, a CMOS circuit that controls the memory cell array MCA is provided below the memory cell array MCA as the stacked structure 200 in some cases. In these cases, in order to electrically connect the memory cell array MCA and the CMOS circuit to each other, a second contact plug (CNTt in FIG. 10) is provided in the stacked structure 200 to extend in a direction in which the conductive layers WL and the insulating layers 25 are stacked. The landings (intermediate regions) between the first step parts P1_1 to P8_1 and the second step parts P1_2 to P8_2 of the step pairs P1 to P8 and the second step parts P1_2 to P8_2 can be used as regions in which the contact plugs CNTt are formed. Therefore, in this case, a layout area of a semiconductor device is not largely increased even when the landings and the second step parts P1_2 to P8_2 are provided. In addition, in the present embodiment, the step ST10 is provided in a substantially plane shape in the stacking direction of the stacked structure 200, as illustrated in FIG. 5. However, the step ST10 may have a convex portion and a concave portion to a certain degree in its wall.

Next, a manufacturing method of a semiconductor device according to the first embodiment is described.

FIGS. 6A to 10 are cross-sectional views illustrating an example of a manufacturing method of a semiconductor device according to the first embodiment. FIGS. 6A to 10 illustrate cross-sections of the step pairs P1 to P4 while the other step pairs are omitted.

First, a CMOS circuit (reference numeral 10 in FIG. 10) used as a control circuit is formed on a semiconductor substrate. After an interlayer dielectric film, for example, is formed on the CMOS circuit, a three-dimensional memory cell array MCA is formed above the interlayer dielectric film. The memory cell array MCA has the stacked structure 200 including the conductive layers WL and the insulating layers 25 that are alternately stacked, as illustrated in FIG. 6A. FIGS. 6A to 10 illustrate an end of the stacked structure 200 formed by the conductive layers WL and the insulating layers 25. The memory cell array MCA itself is not illustrated. Further, an interface between one conductive layer WL and one insulating layer 25 (the broken line in FIG. 5) is also omitted in FIGS. 6A to 10 for easy understanding.

Next, a first resist film PR1 is formed on the stacked structure 200 by a lithography technique, as illustrated in FIG. 6A. The first resist film PR1 is formed between regions where adjacent step pairs P1 to P4 are formed. That is, the first resist film PR1 is formed in a region other than the regions where the step pairs P1 to P4 are formed.

Because step parts of the step pairs P1 to P4 are transferred from lowermost patterns, the region where the step pairs P1 to P4 are formed are initially regions Rp1_1 to Rp4_1 that respectively correspond to landings of the step pairs P1 to P4, as illustrated in FIGS. 6A and 6B. Therefore, the first resist film PR1 initially covers a region other than the regions Rp1_1 to Rp4_1 respectively corresponding to the landings of the step pairs P1 to P4, for example.

Next, each of the uppermost conductive layer WL and one of the insulating layers 25 arranged below the uppermost conductive layer WL is etched by using the first resist film PR1 as a mask (first process). Due to this etching, the lowermost patterns of the step parts P1_1 to P4_1 and P1_2 to P4_2 of the step pairs P1 to P4 are transferred to the uppermost conductive layer WL and the insulating layer 25 (hereinafter, also stacked films WL and 25).

Next, the first resist film PR1 is isotropically etched, so that both side surfaces thereof are slightly etched (a second process). That is, the first resist film PR1 is subjected to slimming. Due to slimming of the first resist film PR1, each of the side surfaces of the first resist film PR1 is etched by a tread width Wst (a length in the direction D1 or D2) of a single step of the step parts P1_1 to P4_1 and P1_2 to P4_2. Therefore, the width of the first resist film PR1 in the direction D1 or D2 is reduced by twice the tread width Wst. To the contrary, each of the regions Rpt to Rp4 where the step pairs P1 to P4 are formed becomes wider by twice the tread width Wst.

The first process is performed again by using the first resist film PR1 after sliming and the uppermost stacked films WL and 25 as a mask. Due to this process, the second lowermost patterns of the step parts P1_1 to P4_1 and P1_2 to P4_2 of the step pairs P1 to P4 are transferred to the uppermost stacked films WL and 25, and the patterns of the uppermost stacked films WL and 25 (the lowermost patterns) are transferred to the second uppermost stacked films WL and 25. Therefore, the patterns of the lowermost steps and the second lowermost steps of the step parts P1_1 to P4_1 and P1_2 to P4_2 are transferred to the stacked structure 200.

Further, the slimming process as the second process and the etching process as the first process are repeated. Every time the sliming process and the etching process are repeated, each of the side surfaces of the first resist film PR1 recedes by the tread width Wst and patterns of the third or subsequent steps from the lowermost steps of the step parts P1_1 to P4_1 and P1_2 to P4_2 are transferred. When the sliming process and the etching process are repeated seven times, patterns of the step parts P1_1 to P4_1 and P1_2 to P4_2 are formed, as illustrated in FIG. 6B. At this time, the regions where the step pairs P1 to P4 are formed are regions Rp1_7 to Rp4_7 illustrated in FIG. 6A. That is, by repeating the sliming process, the regions where the step pairs P1 to P4 are formed become wider from the regions Rp1_1 to Rp4_1 to the regions Rp1_7 to Rp4_7. By repeating the etching process while widening the regions where the step pairs P1 to P4 are formed on both sides by the tread width Wst, the patterns of the step parts P1_1 to P4_1 and P1_2 to P4_2 of the step pairs P1 to P4 as a staircase structure are formed, as illustrated in FIG. 6B. Therefore, the first step parts P1_1 to P4_1 and the second step parts P1_2 to P4_2, of which risers of each step are opposed to each other, are formed. In the etching process, the stacked films WL and 25 are removed pair by pair, and therefore the conductive layer WL is exposed in the tread (the top surface) of each step of the first step parts P1_1 to P4_1 and the second step parts P1_2 to P4_2.

As described above, according to the present embodiment, patterns of the step pairs P1 to P4 can be formed at the same time by using the resist film PR1 formed by a lithography process performed once. That is, it is unnecessary to individually form the patterns of the step pairs P1 to P4 by using different resist films. Therefore, the number of repetitions of the sliming process and the etching process described above is largely reduced.

After the patterns of the step parts P1_1 to P4_1 and P1_2 to P4_2 are formed, the heights of the step pairs P1 to P4 are made different from one another.

For example, after removal of the first resist film PR1, a second resist film PR2 is formed on the stacked structure 200, as illustrated in FIG. 7A. The second resist film PR2 covers the step pair (first step pair) P1 that is the closest to the center of the stacked structure 200 and is located on the memory cell array MCA side. Therefore, an end of the second resist film PR2 is located between the second step part P1_2 of the step pair P1 and the first step part P2_1 of the step pair P2.

Next, the step pairs P2 to P4 are etched by using the second resist film PR2 as a mask, as illustrated in FIG. 7B. The step pairs P2 to P4 are etched by a substantially equal height to the height of the step parts P1_1 and P1_2 of the step pair P1. Due to this etching, the step ST10 having a substantially equal height to the height of the step parts P1_1 and P1_2 is formed between the step pairs P1 and P2. Further, the patterns of the step parts P2_1 to P4_1 and P2_2 to P4_2 of the step pairs P2 to P4 are transferred to lower stacked films WL and 25 as they are. Therefore, the top surfaces of the step pairs P2 to P4 are flush with the landing of the step pair P1, and the treads of the step part P2_1 are continuous to the treads of the step part P1_1. That is, steps of the step parts P1_1 and P2_1 are formed by the stacked films WL and 25 that are continuously stacked.

Figures 8A, 8B:
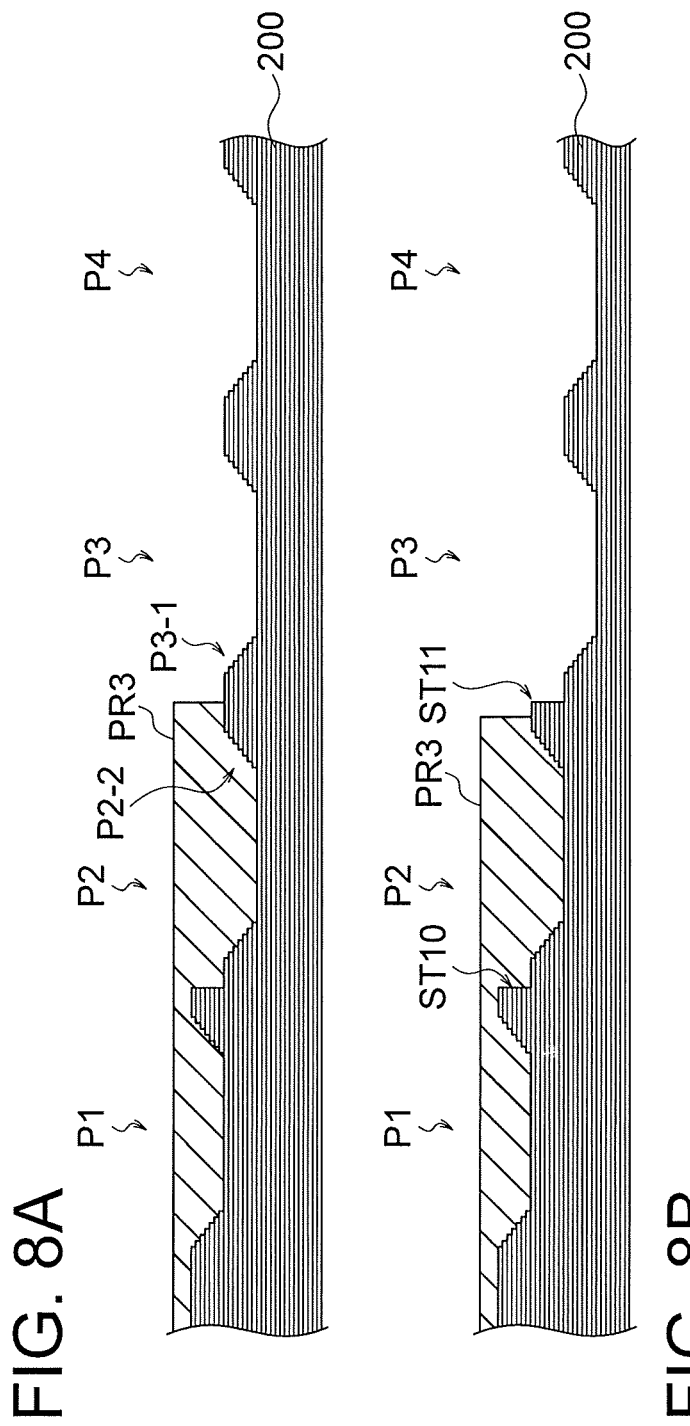

Next, after removal of the second resist film PR2, a third resist film PR3 is formed on the stacked structure 200, as illustrated in FIG. 8A. The third resist film PR3 covers the step pair P1 and the step pair P2 adjacent to the step pair P1, that is, the first and second step pairs P1 and P2 from the memory cell array MCA side. Therefore, an end of the third resist film PR3 is located between the second step part P2_2 of the step pair P2 and the first step part P3_1 of the step pair P3.

Next, the step pairs P3 and P4 are etched by using the third resist film PR3 as a mask, as illustrated in FIG. 8B. The step pairs P3 and P4 are etched by a substantially equal height to the height of the step parts P2_1 and P2_2 of the step pair P2. Due to this etching, a step ST11 having a substantially equal height to the height of the step parts P2_1 and P2_2 is formed between the step pairs P2 and P3. Further, the patterns of the step parts P3_1, P4_1, P3_2, and P4_2 of the step pairs P3 and P4 are transferred to further lower stacked films WL and 25 as they are. Therefore, the top surfaces of the step pairs P3 and P4 are flush with the landing of the step pair P2, and the treads of the step part P3_1 are continuous to the treads of the step part P2_1. That is, steps of the step parts P2_1 and P3_1 are formed by the stacked films WL and 25 that are continuously stacked.

Next, after removal of the third resist film PR3, a fourth resist film PR4 that covers the step pairs P1 to P3 is formed on the stacked structure 200, as illustrated in FIG. 9A. The fourth resist film PR4 covers the step pairs P1 and P2 and the step pair P3 adjacent to the step pair P2, that is, the first to third step pairs P1 to P3 from the memory cell array MCA side. Therefore, an end of the fourth resist film PR4 is located between the second step part P3_2 of the step pair P3 and the first step part P4_1 of the step pair P4.

Next, the step pair P4 is etched by using the fourth resist film PR4 as a mask, as illustrated in FIG. 9B. The step pair P4 is etched by a substantially equal height to the height of the step parts P3_1 and P3_2 of the step pair P3. Due to this etching, a step ST12 having a substantially equal height to the height of the step parts P3_1 and P3_2 is formed between the step pairs P3 and P4. Further, the patterns of the step parts P4_1 and P4_2 of the step pair P4 are transferred to further lower stacked films WL and 25 as they are. Therefore, the top surface of the step pair P4 is flush with the landing of the step pair P3, and the treads of the step part P4_1 are continuous to the treads of the step part P3_1. That is, steps of the step parts P3_1 and P4_1 are formed by the stacked films WL and 25 that are continuously stacked.

By repeating the lithography process and the etching process described above, the step pairs P1 to P4 are formed to have different heights from one another, and the first step parts P1_1 to P4_1 of the step pairs P1 to P4 are formed by the stacked films WL and 25 that are continuously stacked. Therefore, an upper surface of each conductive layer WL of the stacked structure 200 is exposed as a tread of each step of the staircase structure STP, so that it is possible to connect a contact plug to every conductive layer WL.

After removal of the fourth resist film PR4, an interlayer dielectric film ILD is formed on the stacked structure 200, and contact plugs CNT as first contact plugs are formed in the interlayer dielectric film ILD, as illustrated in FIG. 10. The contact plugs CNT are provided on treads of respective steps of the second step parts P1_2 to P4_2 and are connected to the respective conductive layer WL.

Further, when the CMOS circuit 10 is provided below the memory cell array MCA as illustrated in FIG. 10, the CMOS circuit 10 and wiring layers W1, W2, W3, and W4 above the memory cell array MCA are electrically connected to each other in some cases. In these cases, the contact plugs CNTt as second contact plugs are formed, which electrically connect the CMOS circuit 10 and the wiring layers W1, W2, W3, and W4 to each other. The contact plugs CNTt are provided in the stacked structure 200 to extend in the direction in which the conductive layers WL and the insulating layers 25 are stacked. The contact plugs CNTt are provided in at least either landings (intermediate regions) between the first step parts and the second step parts of the respective step pairs P1 to P4 or the second step parts. That is, the landings of the step pairs P1 to P4 according to the present embodiment can be used for the contact plugs CNTt, because no contact plug CNT is provided thereon. Further, regions of the second step parts P1_2 to P4_2 in the respective step pairs P1 to P4 can be also used for the contact plugs CNTt, because no contact plug CNT is provided thereon. Therefore, even when the step pairs P1 to P4 respectively include the landings and the second step parts P1_2 to P4_2, increase of a layout area of the memory cell array MCA can be suppressed by effectively using those regions.

In addition, in the present embodiment, a width W10 of the intermediate region between the first step part and the second step part is equal to or more than twice a width W11 of the first or second step part. Furthermore, a width W12 of a landing between adjacent step pairs (for example, one flat portion between the step pairs P3 and P4) is substantially the same as the width W11 of the first or second step part.

As described above, according to the present embodiment, patterns of respective step parts of the step pairs P1 to P4 can be formed at the same time by using the resist film PR1 formed by a lithography process performed once. Therefore, the number of repetitions of the sliming process and the etching process described above is largely reduced. Because a device used in the sliming process is expensive, reduction of the number of the sliming process reduces not only the manufacturing time but also the manufacturing cost.

Further, the lithography process for the resist film PR2 and the subsequent lithography processes, which form the steps ST10 to ST12, do not require an alignment accuracy so much as that in the lithography process for the resist film PR1 forming the step parts P1_1 to P4_1 and P1_2 to P4_2. In the present embodiment, it suffices that the lithography process required for the step parts P1_1 to P4_1 and P1_2 to P4_2 is performed only once. Therefore, also from this point of view, it is possible to reduce the manufacturing time and the manufacturing cost.

In addition, the resist film PR1 is formed on a substantially flat top surface of the stacked structure 200. Therefore, the patterns of the step parts P1_1 to P4_1 and P1_2 to P4_2 of the step pairs P1 to P4 are formed by processing the substantially flat stacked structure 200. Accordingly, dimensional variation of steps of the step parts P1_1 to P4_1 and P1_2 to P4_2 are reduced, so that a dimensional accuracy is improved. Because dimensional margin can be reduced due to improvement of the dimensional accuracy of each step of the step parts P1_1 to P4_1 and P1_2 to P4_2, the entire area of the staircase structure STP can be made smaller. In the above manufacturing method, only the step pairs P1 to P4 have been described. However, the number of step pairs in the staircase structure STP is not specifically limited.

Modification

In the first embodiment, the heights of the step pairs P1 to P4 are made different from one another by performing etching while increasing the number of step pairs covered by a resist film one by one from the closest step pair to the center of the stacked structure 200 (a step pair located on the memory cell array MCA side), after the process illustrated in FIG. 6B. That is, the steps ST10 to ST12 are formed in the order of ST10, ST11, and ST12.

However, the heights of the step pairs P1 to P4 may be made different from one another by performing etching while increasing the number of step pairs exposed from a resist film one by one from a step pair located at an end of the stacked structure 200. That is, the steps ST10 to ST12 may be formed in the order of ST12, ST11, and ST10.

For example, FIGS. 11A to 13B are cross-sectional views illustrating an example of a manufacturing method of a semiconductor device according to a modification of the first embodiment. FIGS. 11A to 13B illustrate cross-sections of the step pairs P1 to P4 while the other step pairs are omitted.

After the processes illustrated in FIGS. 6A and 6B, the second resist film PR2 is formed on the stacked structure 200, as illustrated in FIG. 11A. The second resist film PR2 exposes the step pair (third step pair) P4 that is the closest to an end of the stacked structure 200 and is located on an outer peripheral side of the stacked structure 200.

Next, the step pair P4 is etched by using the second resist film PR2 as a mask, as illustrated in FIG. 11B. The step pair P4 is etched by a substantially equal height to the height of the step parts P3_1 and P3_2 of the step pair P3. Due to this etching, the step ST12 having a substantially equal height to the height of the step parts P3_1 and P3_2 is formed between the step pairs P3 and P4. Further, the patterns of the step parts P4_1 and P4_2 of the step pair P4 are transferred to lower stacked films WL and 25 as they are.

Next, after removal of the second resist film PR2, the third resist film PR3 is formed on the stacked structure 200, as illustrated in FIG. 12A. The third resist film PR3 exposes the step pair P4 and the step pair P3 adjacent to the step pair P4, that is, the first and second step pairs P3 and P4 from the outer peripheral side of the stacked structure 200.

Next, the step pairs P3 and P4 are etched by using the third resist film PR3 as a mask, as illustrated in FIG. 12B.

The step pairs P3 and P4 are etched by a substantially equal height to the height of the step parts P2_1 and P2_2 of the step pair P2. Due to this etching, the step ST11 having a substantially equal height to the height of the step parts P2_1 and P2_2 is formed between the step pairs P2 and P3. Further, the patterns of the step parts P3_1, P4_1, P3_2, and P4_2 of the step pairs P3 and P4 are transferred to further lower stacked films WL and 25 as they are.

Figures 13A, 13B:
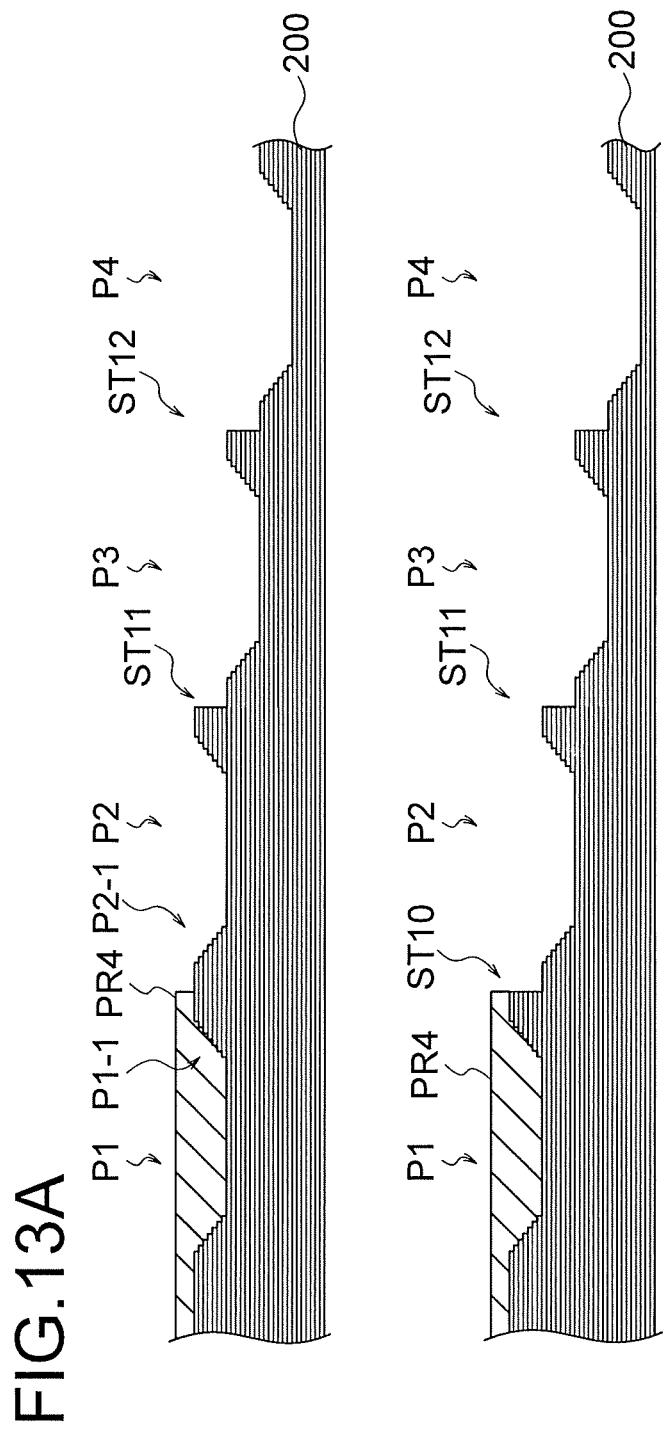

Next, after removal of the third resist film PR3, the fourth resist film PR4 is formed on the stacked structure 200, as illustrated in FIG. 13A. The fourth resist film PR4 exposes the step pairs P4 and P3 and the step pair P2 adjacent to the step pair P3, that is, the first to third step pairs P2 to P4 from the outer peripheral side of the stacked structure 200.

Next, the step pairs P2 to P4 are etched by using the fourth resist film PR4 as a mask, as illustrated in FIG. 13B. The step pairs P2 to P4 are etched by a substantially equal height to the height of the step parts P1_1 and P1_2 of the step pair P1. Due to this etching, the step ST10 having a substantially equal height to the height of the step parts P2_1 and P2_2 is formed between the step pairs P1 and P2. Further, the patterns of the step parts P2_1 to P4_1 and P2_2 to P4_2 of the step pairs P2 to P4 are transferred to further lower stacked films WL and 25 as they are.

Also in this modification, it is possible to make the heights of the step pairs P1 to P4 different from one another while transferring patterns of step parts as they are.

Second Embodiment

FIGS. 14A to 18B are cross-sectional views illustrating an example of a manufacturing method of a semiconductor device according to a second embodiment. FIGS. 14A and 14B illustrate cross-sections of the step pairs P1 to P4, but do not illustrate the other step pairs.

After the processes illustrated in FIGS. 6A and 6B, the second resist film PR2 is formed on the stacked structure 200, as illustrated in FIG. 14A. The second resist film PR2 intermittently exposes the step pairs P1 to P4. That is, the second resist film PR2 covers (or exposes) every other step pair, for example, the step pairs P1, P3, P5, and so on.

Next, the step pairs P1 to P4 are etched by using the second resist film PR2 as a mask, as illustrated in FIG. 14B. The step pairs P2 and P4 are etched by a substantially equal height to the height of the step parts P1_1, P1_2, P3_1, and P3_2 of the step pairs P1 and P3. Due to this etching, the step ST10 having a substantially equal height to the height of the step parts P1_1 and P1_2 is formed between the step pairs P1 and P2. The step ST12 having a substantially equal height to the height of the step parts P3_1 and P3_2 is formed between the step pairs P3 and P4. Further, the patterns of the step parts P2_1, P2_2, P4_1, and P4_2 of the step pairs P2 and P4 are transferred to lower stacked films WL and 25 as they are.

Figure 15:
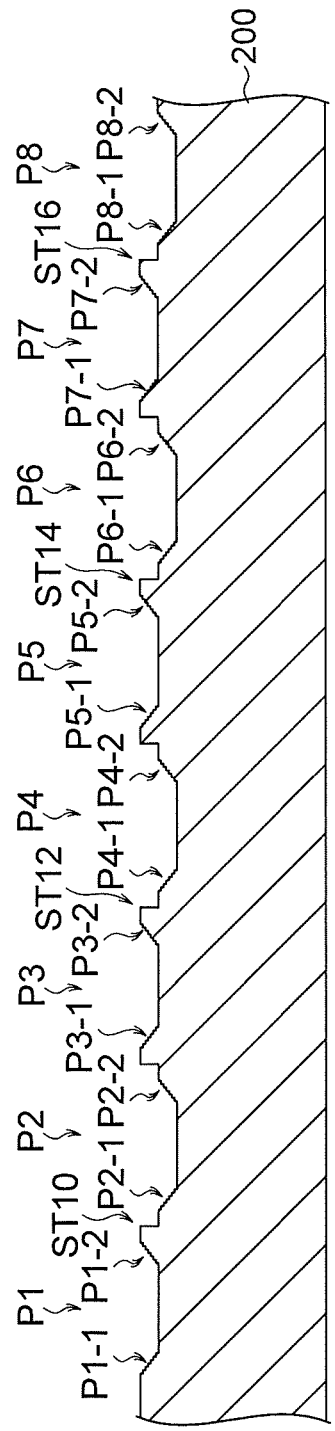

Next, when the second resist film PR2 is removed, a structure illustrated in FIG. 15 is obtained. As illustrated in FIG. 15, the step pairs P1 to P8 are etched intermittently, so that the step pairs P2, P4, P6, and P8 are concave with respect to the other step pairs P1, P3, P5, and P7. Therefore, a step ST14 is located between the step pairs P5 and P6, and a step ST16 is located between the step pairs P7 and P8. FIGS. 15 to 18B illustrate the step pairs P1 to P8 for convenience. It is assumed herein that the step pair P1 is a step pair closest to the center of the stacked structure 200 and the step pair P8 is a step pair located at an end (first end)

of the stacked structure 200. Further, an interface between the conductive layer WL and the insulating layer 25 is omitted in the drawings.

Figure 16A:
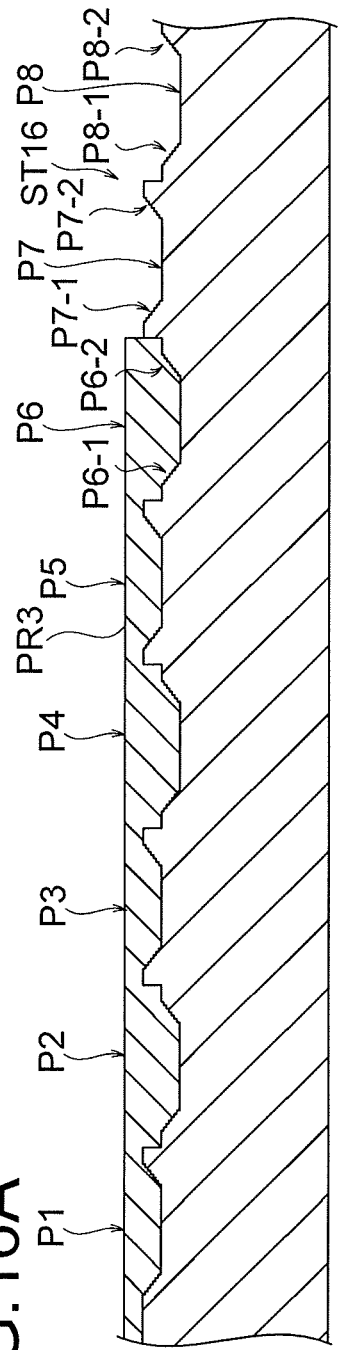

Next, the third resist film PR3 is formed on the stacked structure 200, as illustrated in FIG. 16A. The third resist film PR3 exposes the first and second step pairs from the end (first end) of the stacked structure 200, that is, the step pairs P7 and P8.

Figure 16B:
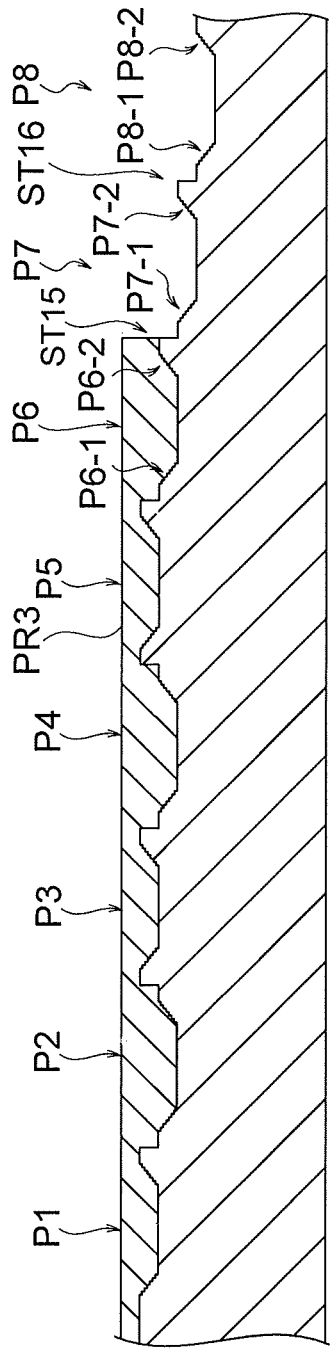

Next, the step pairs P7 and P8 are etched by using the third resist film PR3 as a mask, as illustrated in FIG. 16B. The step pairs P7 and P8 are etched by a substantially equal height to the height of the step parts P6_1 and P6_2 of the step pair P6 and the height of the step parts P7_1 and P7_2 of the step pair P7. Because the heights of the step parts P6_1, P6_2, P7_1, and P7_2 are substantially equal to one another, it can be said that the step pairs P7 and P8 are etched by a height that is twice as high as the height of the step part P7_1. The step pair P7 is originally located at a level higher than the step pair P6 by the height of the step part P7_1 in the state in FIG. 15. However, the step pair P7 is etched by the height that is twice as high as the step part P7_1, and therefore becomes lower than the step pair P6 by the height of the step part P7_1. Therefore, a step ST15 having the height of the step part P7_1 is formed between the step pairs P6 and P7, as illustrated in FIG. 16B. Further, the patterns of the step parts P7_1, P8_1, P7_2, and P8_2 of the step pairs P7 and P8 are transferred to further lower stacked films WL and 25 as they are. A pattern of the ST16 is also transferred to lower stacked films WL and 25 as it is. Therefore, it is possible to make the heights of the step pairs P5 to P8 different from one another while transferring the patterns of step pairs P7 and P8 as they are.

Next, after removal of the third resist film PR3, the fourth resist film PR4 is formed on the stacked structure 200, as illustrated in FIG. 17A. The fourth resist film PR4 exposes the first to fourth step pairs from the end (first end) of the stacked structure 200, that is, the step pairs P5 to P8.

Next, the step pairs P5 to P8 are etched by using the fourth resist film PR4 as a mask, as illustrated in FIG. 17B. The step pairs P5 to P8 are also etched by a height that is twice as high as the step part P5_1. In the state in FIG. 17A, the step pair P5 is located at a level higher than the step pair P4 by the height of the step part P5_1. However, the step pair P5 is etched by the height that is twice as high as the step part P5_1, and therefore becomes lower than the step pair P4 by the height of the step part P5_1. Therefore, a step ST13 having the height of the step part P5_1 is formed between the step pairs P4 and P5, as illustrated in FIG. 17B. Further, the patterns of the step parts P5_1 to P8_1 and P5_2 to P8_2 of the step pairs P5 to P8 are transferred to further lower stacked films WL and 25 as they are. The patterns of the steps ST14 to ST16 are also transferred to lower stacked films WL and 25 as they are. Therefore, it is possible to make the heights of the step pairs P3 to P8 different from one another while transferring patterns of step pairs P5 to P8 as they are.

Figure 18A:
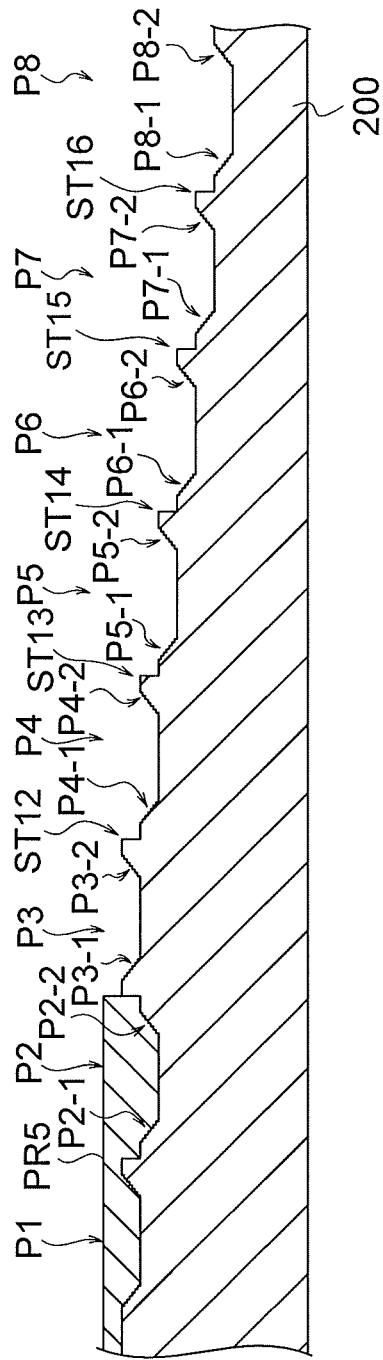

Next, after removal of the fourth resist film PR4, a fifth resist film PR5 is formed on the stacked structure 200, as illustrated in FIG. 18A. The fifth resist film PR5 exposes the first to sixth step pairs from the end (first end) of the stacked structure 200, that is, the step pairs P3 to P8.

Figure 18B:
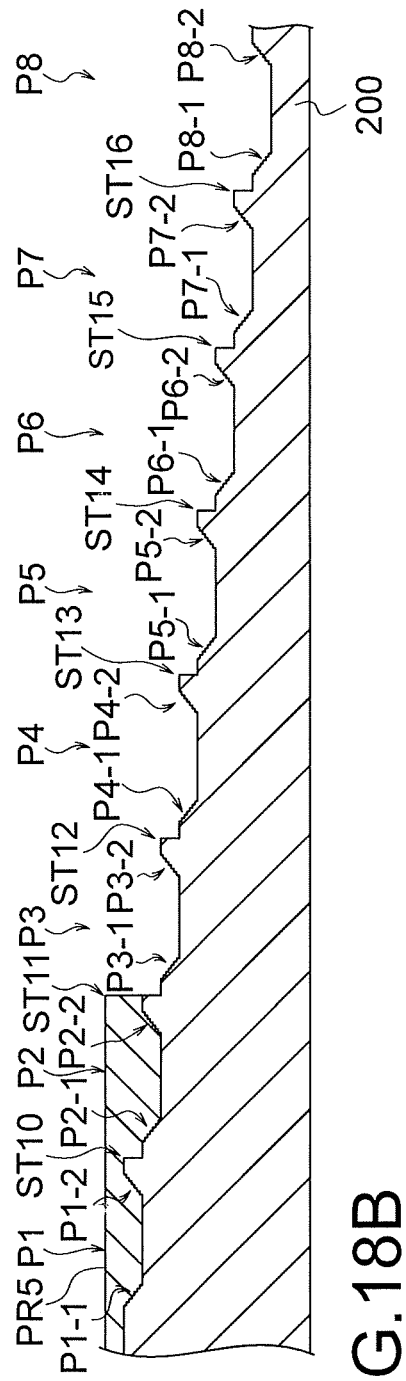

Next, the step pairs P3 to P8 are etched by using the fifth resist film PR5 as a mask, as illustrated in FIG. 18B. The step pairs P3 to P8 are also etched by a height that is twice as high as the step part P3_1. In the state in FIG. 18A, the step pair P3 is located at a level higher than the step pair P2 by the height of the step part P3_1. However, the step pair P3 is etched by the height that is twice as high as the step part P3_1, and therefore becomes lower than the step pair P2 by the height of the step part P3_1. Therefore, the step ST11 having the height of the step part P3_1 is formed between the step pairs P2 and P3, as illustrated in FIG. 18B. Further, the patterns of the step parts P3_1 to P8_1 and P3_2 to P8_2 of the step pairs P3 to P8 are transferred to further lower stacked films WL and 25 as they are. The patterns of the steps ST12 to ST16 are also transferred to lower stacked films WL and 25 as they are. Therefore, it is possible to make the heights of the step pairs P1 to P8 different from one another while transferring the patterns of step pairs P3 to P8 as they are.

When the fifth resist film PR5 is removed, the structure illustrated in FIG. 4 is obtained.

When there are further step pairs, by further repeating the lithography process and the etching process described above, it is possible to make the heights of the step pairs different from one another while transferring patterns of step parts as they are.

Also with this processing, a configuration identical to that of the semiconductor device according to the first embodiment can be obtained. Further, in the second embodiment, the step pairs P1 to P4 are intermittently etched by using the second resist film PR2, and thereafter etching is further performed while the number of step pairs exposed from a resist film is increased two by two. Therefore, the second embodiment can reduce the number of repetitions of the lithography process and the etching process as compared to the first embodiment. Accordingly, it is possible to further reduce the manufacturing time and the manufacturing cost.

Modification

In the second embodiment, after the process illustrated in FIG. 15, etching of the step pairs P1 to P8 is performed while the number of step pairs exposed from a resist film is increased two by two from a step pair located at an end (first end) of the stacked structure 200.

However, it is permissible to etch the step pairs P1 to P8 while the number of step pairs covered by a resist film is increased two by two from a step pair closest to the center of the stacked structure 200 (that is, a step pair located on the memory cell array MCA side).

An example of a manufacturing method of a semiconductor device according to a modification of the second embodiment is described with reference to FIGS. 19A to 21B, for example. When the second resist film PR2 is removed after the processes illustrated in FIGS. 14A and 14B, a structure illustrated in FIG. 15 is obtained.

Next, the third resist film PR3 is formed on the stacked structure 200, as illustrated in FIG. 19A. The third resist film PR3 covers two step pairs P1 and P2 closest to the center of the stacked structure 200.

Next, the step pairs P3 to P8 are etched by using the third resist film PR3 as a mask, as illustrated in FIG. 19B. The step pairs P3 to P8 are etched by a height that is twice as high as the step part P3_1 of the step pair P3. Due to this etching, the step pair P3 becomes lower than the step pair P2, and the step ST11 having a substantially equal height to the height of the step parts P3_1 is formed between the step pairs P2 and P3. Further, the patterns of the step parts P3_1 to P8_1 and P3_2 to P8_2 of the step pairs P3 to P8 are transferred to lower stacked films WL and 25 as they are. The patterns of the steps ST12, ST14, and ST16 are also transferred to lower stacked films WL and 25 as they are. Therefore, it is possible to make the heights of the step pairs P1 to P4 different from one another while transferring the patterns of step pairs P3 to P8 as they are.

Next, after removal of the third resist film PR3, the fourth resist film PR4 is formed on the stacked structure 200, as illustrated in FIG. 20A. The fourth resist film PR4 covers the four step pairs P1 to P4 closest to the center of the stacked structure 200.

Next, the step pairs P5 to P8 are etched by using the fourth resist film PR4 as a mask, as illustrated in FIG. 20B. The step pairs P5 to P8 are etched by a height that is twice as high as the step part P5_1 of the step pair P5. Due to this etching, the step pair P5 becomes lower than the step pair P4, and the step ST13 having a substantially equal height to the height of the step part P5_1 is formed between the step pairs P4 and P5. Further, the patterns of the step parts P5_1 to P8_1 and P5_2 to P8_2 of the step pairs P5 to P8 are transferred to lower stacked films WL and 25 as they are. The patterns of the steps ST14 and ST16 are also transferred to lower stacked films WL and 25 as they are. Therefore, it is possible to make the heights of the step pairs P1 to P6 different from one another while transferring the patterns of step pairs P5 to P8 as they are.

Figure 21A:
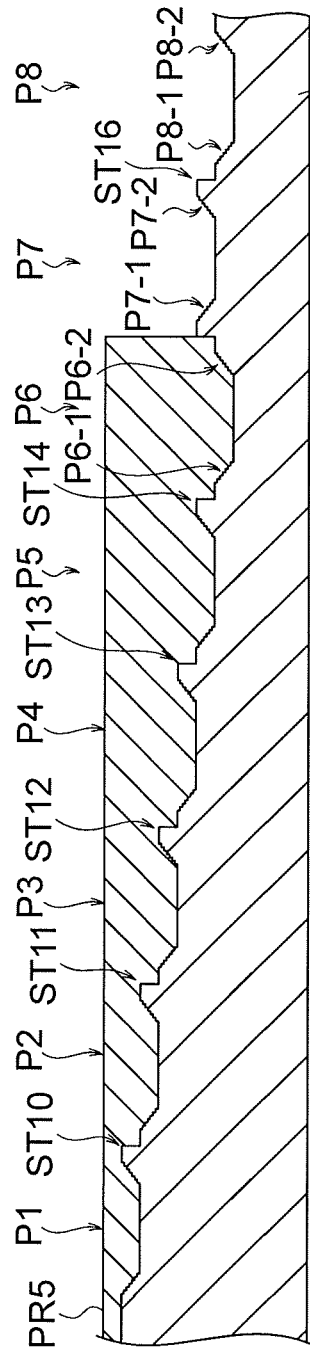

Next, after removal of the fourth resist film PR4, the fifth resist film PR5 is formed on the stacked structure 200, as illustrated in FIG. 21A. The fifth resist film PR5 covers six step pairs P1 to P6 closest to the center of the stacked structure 200.

Figure 21B:
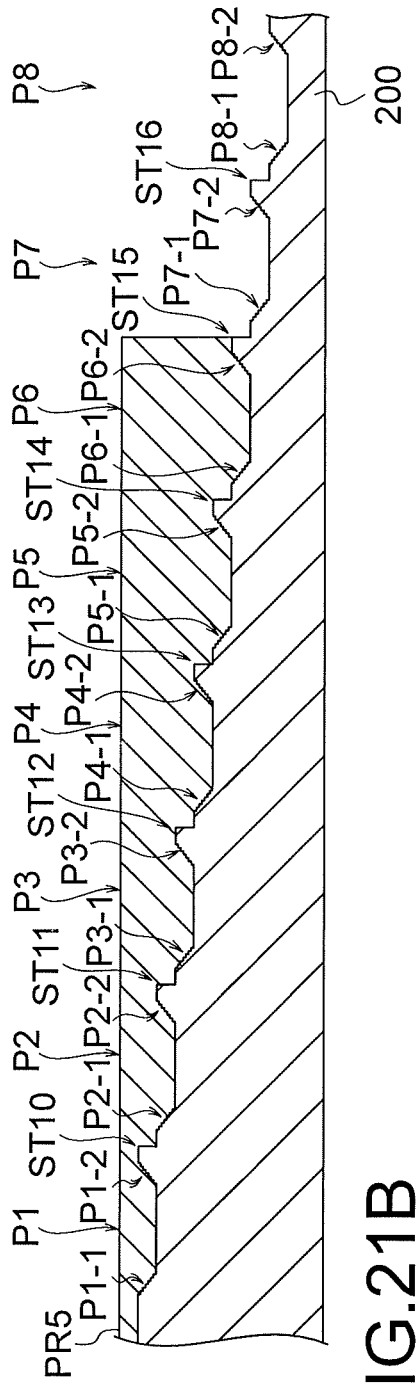

Next, the step pairs P7 and P8 are etched by using the fifth resist film PR5 as a mask, as illustrated in FIG. 21B. The step pairs P7 and P8 are etched by a height that is twice as high as the step part P7_1 of the step pair P7. Due to this etching, the step pair P7 becomes lower than the step pair P6, and the step ST15 having a substantially equal height to the height of the step part P7_1 is formed between the step pairs P6 and P7. Further, the patterns of the step parts P7_1, P8_1, P7_2, and P8_2 of the step pairs P7 and P8 are transferred to lower stacked films WL and 25 as they are. The pattern of the ST16 is also transferred to lower stacked films WL and 25 as it is. Therefore, it is possible to make the heights of the step pairs P1 to P8 different from one another while transferring the patterns of step pairs P7 and P8 as they are.

When the fifth resist film PR5 is removed, a structure illustrated in FIG. 4 is obtained.

When there is another step pair, after removal of the fifth resist film PR5, another resist film (not illustrated) is further formed on the stacked structure 200. The resist film covers the first to 2n-th step pairs from the center of the stacked structure 200. Thereafter, the stacked structure 200 is etched by using that resist film as a mask. By repeating the lithography process and the etching process as described above, it is possible to make the heights of step pairs different from each other while transferring patterns of step parts as they are.

Planar Layout

Figure 22:
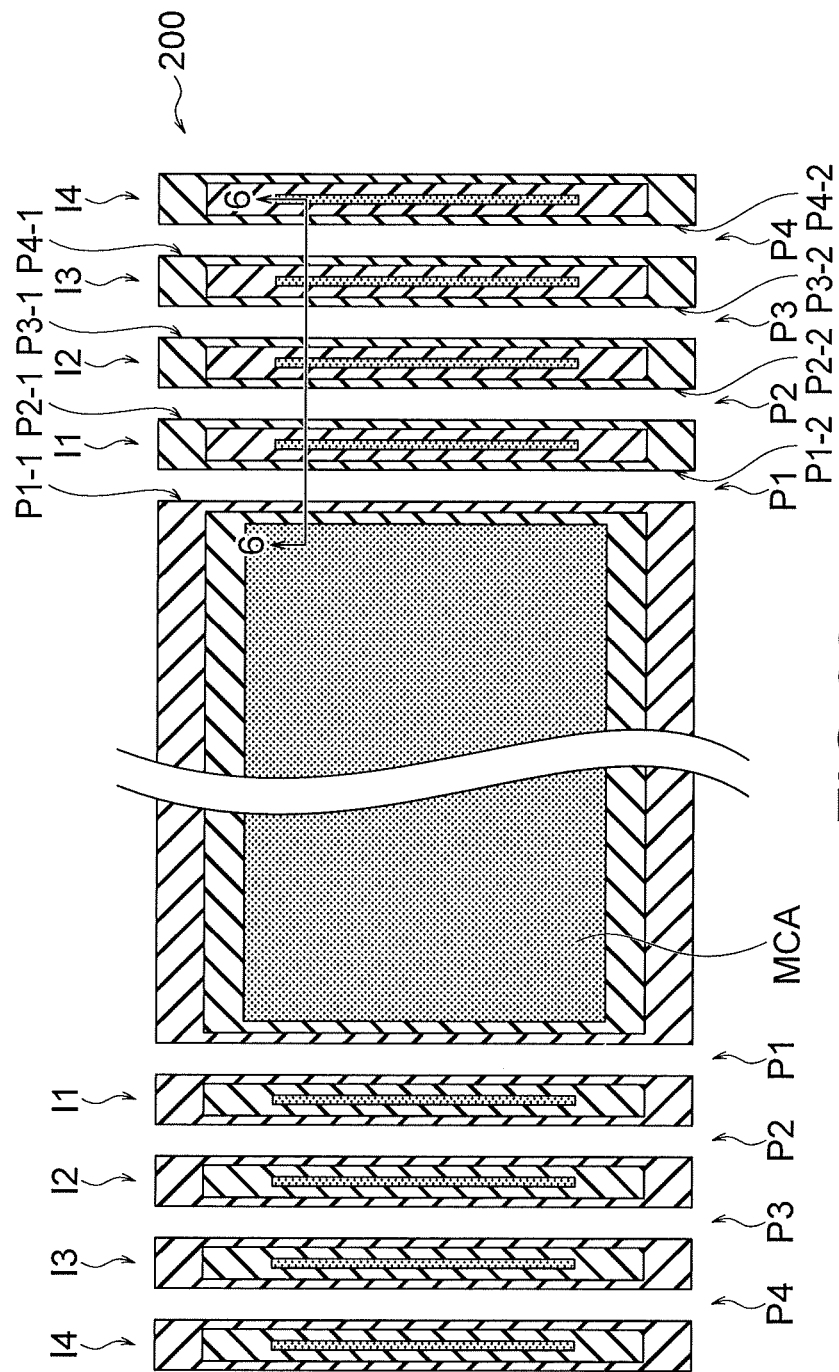
FIG. 22 is a schematic plan view illustrating the step pairs P1 to P4 and the memory cell array illustrated in FIG. 6B.

FIG. 22 is a schematic plan view illustrating the step pairs P1 to P4 and the memory cell array MCA illustrated in FIG. 6B. A cross-section in FIG. 6B corresponds to a cross-section taken along a line 6-6 in FIG. 22. FIG. 22 schematically illustrates the step parts P1_1 to P4_1 and P1_2 to P4_2. Further, while the step pairs P1 to P4 are provided on each side of the memory cell array MCA in FIG. 22, FIG. 6B only illustrates the cross-sections of the step pairs P1 to P4 on one side of the memory cell array MCA.

As illustrated in FIG. 22, the step pairs P1 to P4 are obtained by providing long and narrow islands I1 to I4 that extend along a side of the memory cell array MCA. The islands I1 to I4 are patterns separated from the memory cell array MCA and are regions where the first resist film PR1 illustrated in FIG. 6A is formed. By repeating a sliming process and an etching process for the first resist film PR1 on the islands I1 to I4, the step parts P1_1 to P4_1 and P1_2 to P4_2 are formed at the same time in the memory cell array MCA and the islands I1 to I4.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
a substrate;
a plurality of conductive layers and a plurality of insulating layers that are stacked above the substrate, where an end of a stacked structure formed by the conductive layers and the insulating layers having a staircase structure in which the conductive layers form treads of respective steps, the staircase structure including a step pair formed by a first step part and a second step part, risers of respective steps of the step pair being opposed to each other, and a plurality of the step pairs being provided at different levels in the form of a staircase in the staircase structure;
a plurality of first contact plugs provided on treads of respective steps of the first step part;
second contact plugs provided in both of an intermediate region between the first step part and the second step part of the step pair and the second step part to extend in the stacked structure in a direction in which the conductive layers and the insulating layers are stacked; and
a CMOS (Complementary Metal Oxide Semiconductor) circuit provided below the stacked structure and electrically connected to the second contact plugs, wherein the second contact plugs are provided in both of the intermediate region in which the first contact plug is not formed thereon and the second step part in which the first contact plug is not formed thereon.

2. The device of claim 1, wherein a step having a substantially same height as the first or second step part is provided between the step pairs adjacent to each other.

3. The device of claim 1, wherein the first and second step parts of the step pair are substantially symmetrical to each other.

4. The device of claim 2, wherein the first and second step parts of the step pair are substantially symmetrical to each other.

5. The device of claim 1, wherein a width of the intermediate region is equal to or more than twice a width of the first or second step part.

6. The device of claim 1, wherein a width of a landing between the step pairs adjacent to each other is substantially same as a width of the first or second step part.

7. A manufacturing method of a semiconductor device, comprising:

forming a stacked structure in which a plurality of conductive layers and a plurality of insulating layers are stacked above a substrate;

forming a first resist film on the stacked structure;

forming a plurality of step pairs each formed by a first step part and a second step part by repeating a first process that etches one of the conductive layers and one of the insulating layers by using the first resist film as a mask and a second process that etches side surfaces of the first resist film, risers of respective step being opposed to each other;

forming a second resist film on the stacked structure; and etching one or more of the step pairs of the stacked structure by using the second resist film as a mask to make the one or more step pairs have different heights from other step pairs, wherein the first resist film is formed between regions where the step pairs adjacent to each other are formed, the second resist film covers a first step pair that is a closest one of the step pairs to a center of the stacked structure, the stacked structure is etched using the second resist film as a mask, after the second resist film is removed, a third resist film is formed to cover the first step pair and a second step pair adjacent to the first step pair, and the stacked structure is etched using the third resist film as a mask.

8. A manufacturing method of a semiconductor device comprising:

forming a stacked structure in which a plurality of conductive layers and a plurality of insulating layers are stacked above a substrate;

forming a first resist film on the stacked structure;

forming a plurality of step pairs each formed by a first step part and a second step part by repeating a first process that etches one of the conductive layers and one of the insulating layers by using the first resist film as a mask and a second process that etches side surfaces of the first resist film, risers of respective step being opposed to each other;

forming a second resist film on the stacked structure; and etching one or more of the step pairs of the stacked structure by using the second resist film as a mask to make the one or more step pairs have different heights from other step pairs, wherein the first resist film is formed between regions where the step pairs adjacent to each other are formed, the second resist film intermittently exposes the step pairs, the step pairs are etched using the second resist film as a mask, after the second resist film is removed, a third resist film is formed to expose two of the step pairs from a first end of the stacked structure, the step pairs are etched using the third resist film as a mask, after the third resist film is removed, a fourth resist film is formed to expose four of the step pairs from the first end of the stacked structure, and the step pairs are etched using the fourth resist film as a mask.

* * * * *